United States Patent
Choi et al.

(10) Patent No.: US 11,133,834 B2
(45) Date of Patent: Sep. 28, 2021

(54) DEVICE AND METHOD OF COMPENSATING FOR NONLINEARITY OF POWER AMPLIFIER

(71) Applicant: SAMSUNG ELECTRONICS CO., LTD., Suwon-si (KR)

(72) Inventors: Hongmin Choi, Suwon-si (KR); Junse Lee, Suwon-si (KR); Hyunseok Yu, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/736,956

(22) Filed: Jan. 8, 2020

(65) Prior Publication Data
US 2020/0287578 A1    Sep. 10, 2020

(30) Foreign Application Priority Data

Mar. 7, 2019 (KR) .................. 10-2019-0026323
Jun. 4, 2019 (KR) .................. 10-2019-0066062

(51) Int. Cl.
*H04B 1/04* (2006.01)
*H03F 1/32* (2006.01)
*H03F 3/24* (2006.01)

(52) U.S. Cl.
CPC ......... *H04B 1/0475* (2013.01); *H03F 1/3247* (2013.01); *H03F 3/245* (2013.01); *H03F 2200/451* (2013.01); *H04B 2001/0425* (2013.01)

(58) Field of Classification Search
CPC combination set(s) only.
See application file for complete search history.

(56) References Cited

U.S. PATENT DOCUMENTS

| 8,093,949 | B2 | 1/2012 | Brown et al. | |
| 8,229,025 | B1* | 7/2012 | Summerfield | H04L 27/368 375/296 |
| 8,354,884 | B2 | 1/2013 | Braithwaite | |
| 8,913,689 | B2 | 12/2014 | Kim et al. | |
| 9,484,962 | B1* | 11/2016 | Magesacher | H04B 1/0475 |
| 9,595,982 | B2* | 3/2017 | Weber | H03F 1/3247 |
| 9,749,161 | B1 | 8/2017 | Gal et al. | |
| 9,948,245 | B2 | 4/2018 | Kerek et al. | |
| 10,075,201 | B1* | 9/2018 | Gazneli | H03F 3/245 |

(Continued)

FOREIGN PATENT DOCUMENTS

KR    10-0366289    12/2002

*Primary Examiner* — Junpeng Chen
(74) *Attorney, Agent, or Firm* — F. Chau & Associates, LLC

(57) ABSTRACT

Systems and methods are described to perform wireless communication. The device includes a pre-distortion circuit configured to pre-distort an input signal based on a parameter set including a plurality of coefficients and generate a pre-distorted signal, a power amplifier configured to amplify the pre-distorted signal and generate an output signal, and a parameter obtaining circuit configured to perform an iterative approximation operation based on the output signal and the pre-distorted signal, which change over time, according to an indirect training structure configured to minimize a difference between an intermediate signal obtained based on the output signal and the pre-distorted signal, and obtain the parameter set.

18 Claims, 15 Drawing Sheets

(56) References Cited

U.S. PATENT DOCUMENTS

| | | | | |
|---|---|---|---|---|
| 2005/0242876 A1* | 11/2005 | Obernosterer | ........ | H03F 1/3294 330/149 |
| 2006/0039498 A1 | 2/2006 | De Figueiredo et al. | | |
| 2007/0063770 A1* | 3/2007 | Rexberg | ................ | H03F 1/3247 330/149 |
| 2012/0314746 A1* | 12/2012 | Lorenz | .................. | H03F 1/3294 375/224 |
| 2013/0107914 A1* | 5/2013 | Park | ...................... | H04B 1/406 375/219 |
| 2014/0292406 A1* | 10/2014 | Dechen | ................... | H03F 3/195 330/149 |
| 2015/0214904 A1* | 7/2015 | Lozhkin | ................ | H03F 1/3247 330/75 |
| 2018/0026587 A1 | 1/2018 | Reichl et al. | | |

* cited by examiner

FIG. 6B

Start from $x_0$ .................................................... (1)
$r_0 := b - Ax_0$ .................................................. (2)
if $r_0$ is sufficiently small, then return $x_0$ as the result ............ (3)
$P_0 := r_0$ ......................................................... (4)
$k := 0$ ............................................................. (5)
repeat ............................................................... (6)

$$\alpha_k := \frac{r_k^T r_k}{P_k^T A r_k} \quad (7)$$

$$x_{k+1} := x_k + \alpha_k P_k \quad (8)$$

$$r_{k+1} := r_k - \alpha_k A P_k \quad (9)$$

if $R_{k+1}$ is sufficiently small, then exit loop ..................... (10)

$$\beta_k := \frac{r_{k+1}^T r_{k+1}}{P_k^T r_k} \quad (11)$$

$$P_{k+1} := P_{k+1} + \beta_k P_k \quad (12)$$

$$k := k+1 \quad (13)$$

end repeat ........................................................... (14)
return $x_{k+1}$ as the result ...................................... (15)

DEVICE AND METHOD OF COMPENSATING FOR NONLINEARITY OF POWER AMPLIFIER

CROSS-REFERENCE TO RELATED APPLICATIONS

This application claims the benefit of Korean Patent Application Nos. 10-2019-0026323 and 10-2019-0066062, respectively filed on Mar. 7, 2019 and Jun. 4, 2019, in the Korean Intellectual Property Office, the disclosures of which are incorporated herein in their entirety by reference.

BACKGROUND

The inventive concept relates to a wireless communication device, and more particularly, to a device and method of compensating for the nonlinearity of a power amplifier.

Many people use ireless communication devices such as smartphones and tablet computers. Transmitters are used in wireless communication devices to transmit radio frequency (RF)-band signals.

A baseband signal, or original signal, may be generated prior to transmitting the RF-band signal. Due nonlinearity of the transmitter, the RF-band signal may be distorted while processing the baseband signal to produce the RF-band signal.

The nonlinearity of transmitter effects can reduce the quality of a signal, thereby distorting the RF-band signal. A reduced quality of signal causes disrupted wireless connections, dropped calls, and interruptions in data transfer. Therefore, there is a need in the art to reduce the distortion to the RF-band signal due to nonlinearity of transmitters in wireless communication devices.

SUMMARY

The present disclosure describes a device and method of compensating for the nonlinearity of a power amplifier, which may reduce the amount of operations and reflect characteristics of a power amplifier and peripheral circuits thereof, which change in real-time, in the compensation for nonlinearity.

According to an aspect of the present disclosure, there is provided a device configured to perform wireless communication. The device includes a pre-distortion circuit configured to pre-distort an input signal based on a parameter set including a plurality of coefficients and generate a pre-distorted signal, a power amplifier configured to amplify the pre-distorted signal and generate an output signal, and a parameter obtaining circuit configured to perform an iterative approximation operation based on the output signal changing over time and the pre-distorted signal according to an indirect training structure configured to minimize a difference between an intermediate signal obtained based on the output signal and the pre-distorted signal, and obtain the parameter set.

According to another aspect of the present disclosure, there is provided a method of amplifying a signal of a device. The method includes obtaining an auto-correlation matrix and a cross-correlation vector based on a pre-distorted signal and an output signal, wherein the pre-distorted signal is obtained by pre-distorting an input signal, performing an iterative approximation operation based on the auto-correlation matrix and the cross-correlation vector and generate a coefficient matrix, providing the pre-distorted signal to a power amplifier, wherein the pre-distorted signal is generated by performing pre-distortion using a plurality of coefficients in the coefficient matrix, and amplifying the pre-distorted signal and generating the output signal.

According to another aspect of the present disclosure, there is provided a device configured to perform wireless communication. The device includes a power amplifier configured to amplify a pre-distorted signal and generate an output signal and a processor configured to obtain a solution of a matrix equation using an auto-correlation matrix obtained based on the output signal and a cross-correlation vector obtained based on the output signal and the pre-distorted signal, by using a conjugate gradient method, pre-distort an input signal using a plurality of coefficients in the solution, and provide the pre-distorted signal to the power amplifier.

According to another aspect of the present disclosure, a method of wireless communication is described comprising identifying an input signal; performing a plurality of iterative approximations based on the input signal to generate a coefficient matrix; performing pre-distortion on the input signal based on the coefficient matrix to produce a predistorted signal; amplifying the predistorted signal based to produce an amplified signal; and transmitting the amplified signal.

In some embodiments, each of the plurality of iterative approximations further comprises identifying an approximate coefficient matrix; identifying an auto-correlation matrix; identifying a cross-correlation vector; computing a residue based on the approximate coefficient matrix, the auto-corrleation matrix, and the cross-correlation vector; and comparing the residue to a threshold value. In some cases, the method comprises determining that the residue exceeds the threshold value; computing a gradient vector based on the approximate coefficient matrix; and updating the approximate coefficient matrix based on the gradient vector. In some cases, the method comprises determining that the residue does not exceed the threshold value; and setting the coefficient matrix equal to the approximate coefficient matrix.

BRIEF DESCRIPTION OF THE DRAWINGS

Embodiments of the inventive concept will be more clearly understood from the following detailed description taken in conjunction with the accompanying drawings in which:

FIG. 6B shows an equation for each operation used in an iterative approximation operation of a device according to an example embodiment;

DETAILED DESCRIPTION

The present disclosure relates to a wireless communication device, and more particularly, to a device and method of the compensation of the nonlinearity of a power amplifier in a wireless communication device.

A wireless communication device may include a transmitter configured to provide a radio-frequency (RF)-band signal to an antenna. The transmitter may include components such as a filter, a power amplifier, a mixer, and the like configured to generate an RF-band signal from a baseband signal. During processing of the baseband signal through the transmitters components, the RF-band signal may be distorted due to inherent characteristics of the transmitter components. For example, the transmitter may have nonlinearity between the baseband signal and the RF-band signal. The nonlinearity of the transmitter may distort the RF-band signal and hinder wireless communication. In particular, the RF-band signal may be further distorted due to the nonlinearity of the transmitter when a carrier frequency of the RF-band signal is increased and a plurality of antennas are used and compensating for the nonlinearity of the transmitter may be difficult.

Specifically, in some cases compensating for the nonlinearity of the transmitter may involve minimizing the size of an error matrix by obtaining a solution of a matrix equation such as AX=B. This can be accomplished by finding the inverse matrix of A. However, as the size of A increases, finding the inverse can involve a large number of operations. Furthermore, using fixed matrices for A and B in such an equation may not enable changes to be made in real-time based on current characteristics of the transmitter.

Therefore, in some examples, a conjugate gradient method may be used to solve (or approximately solve) a matrix equation that would otherwise require substantial time and computational resources. The conjugate gradient method may be performed by obtaining an approximate solution using an iterative method. The iteration may continue until the approximation is sufficiently close to the desired result. Also, a wireless device may be configured to perform the conjugate gradient method (and, therefore, pre-distortion), based on matrices A and B that are determined in real-time, and therefore reflect current characteristics of the device.

Example embodiments will now be described in detail with reference to the accompanying drawings in which some example embodiments are shown.

Figure 1:
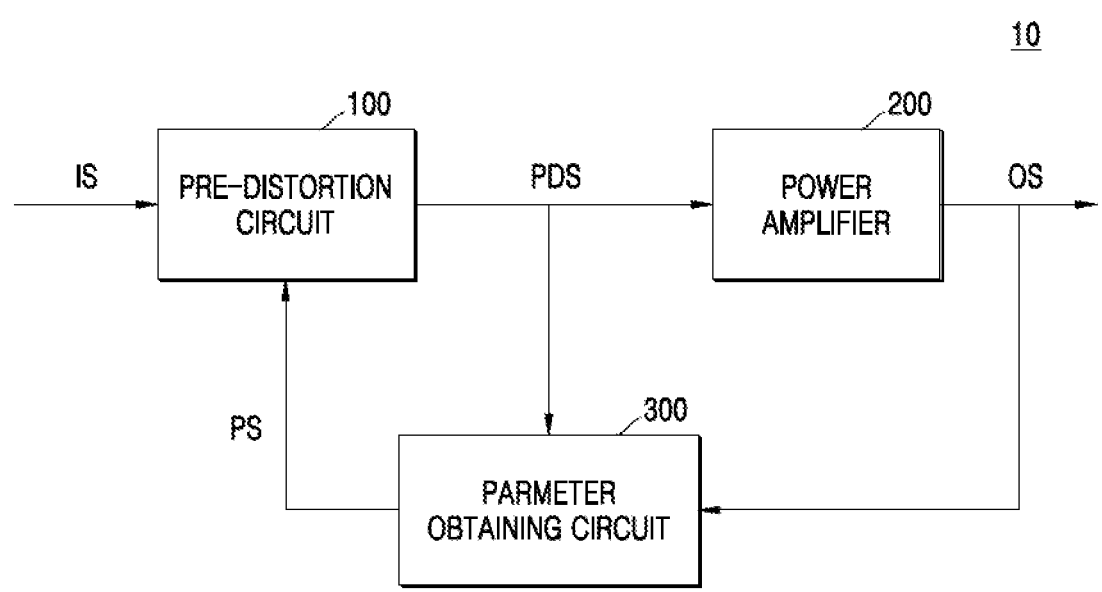
FIG. 1 is a diagram of a device according to an example embodiment.

FIG. 1 is a diagram of a device 10 according to an example embodiment. The device 10 may include a pre-distortion circuit 100, a power amplifier 200, and a parameter obtaining circuit 300. The device 10 may include a communication device. The device 10 may include a wireless communication device. The device 10 may include a base station or user equipment included in a wireless communication system. The wireless communication system may include, but is not limited thereto, a wireless communication system using a cellular network, such as a 5th-generation (5G) wireless system, a long-term evolution (LTE) system, an LTE-Advanced system, a code division multiple access (CDMA) system, and a global system for mobile communications (GSM) system, or include wireless local area network (WLAN), wireless fidelity (WiFi), Bluetooth, or another arbitrary wireless communication system. The base station may be referred to as a Node B, an evolved-Node B (eNB), a sector, a site, a base transceiver system (BTS), an access point (AP), a relay node, a remote radio head (RRH), a radio unit (RU), or a small cell. The user equipment may be referred to as terminal equipment, a mobile station (MS), a mobile terminal (MT), a user terminal (UT), a subscriber station (SS), a wireless device, or a handheld device. The device 10 may further include various components other than components shown in FIG. 1.

The power amplifier 200 may process a signal and generate an output signal OS. For example, the power amplifier 200 may amplify the signal and generate the output signal OS. In an embodiment, the power amplifier 200 may be included in a transmitter included in the device 10.

Although linear characteristics may be used for output characteristics of the power amplifier 200, the power amplifier 200 may also have nonlinear characteristics. The power amplifier 200 may have nonlinear characteristics due to intrinsic characteristics or various ambient factors thereof. In other words, as shown in FIG. 2, the output characteristics of the power amplifier 200 may exhibit nonlinear characteristics.

Figure 2:
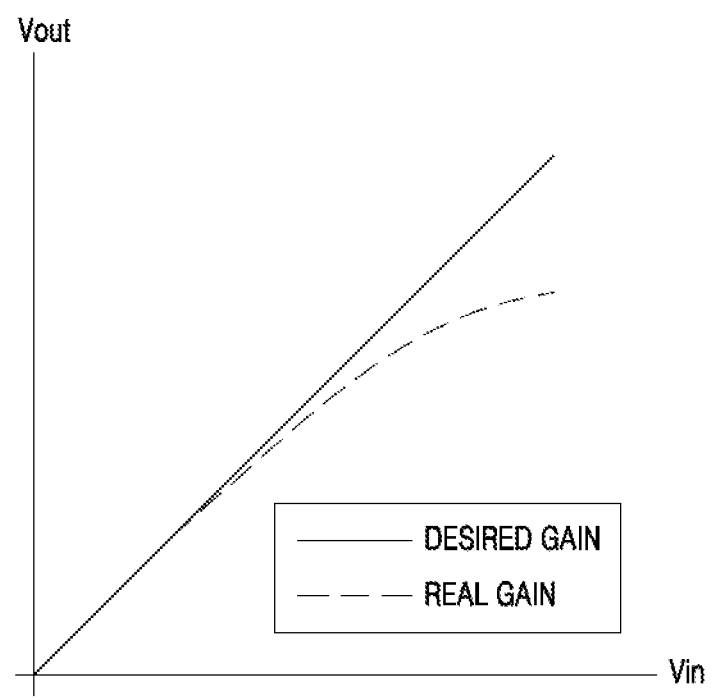
FIG. 2 is a graph showing output characteristics of a power amplifier.

FIG. 2 is a graph showing output characteristics of a power amplifier.

The curve illustrated with a solid line denotes characteristics of a desired gain for a power amplifier 200. As shown in FIG. 2, the gain may exhibit characteristics in which an input voltage is proportional to an output voltage.

However, a real gain of the power amplifier 200 may exhibit characteristics illustrated with a dashed line in FIG. 2. In other words, the real gain of the power amplifier 200 may exhibit nonlinear characteristics in which an input voltage is not proportional to an output voltage in a specific region.

Referring back to FIG. 1, a pre-distortion process may be used to compensate for the nonlinearity of the power amplifier 200. The pre-distortion process may refer to a technique of previously distorting an input signal according to characteristics opposite to the nonlinearity of the power amplifier 200.

For example, the pre-distortion circuit 100 may pre-distort an input signal IS and generate a pre-distorted signal PDS. The pre-distortion circuit 100 may provide the pre-distorted signal PDS to the power amplifier 200. The power amplifier 200 may amplify the pre-distorted signal PDS and generate an output signal OS. The nonlinearity of the power amplifier 200 may be compensated when the pre-distortion circuit 100 pre-distorts the input signal I. In an embodiment, the pre-distortion circuit 100 may digitally pre-distort the input signal IS.

In an embodiment, the pre-distortion circuit 100 may pre-distort the input signal IS based on a parameter set PS. The parameter set PS may be provided by the parameter obtaining circuit 300. The parameter set PS may include a plurality of coefficients used for the pre-distortion of the input signal IS.

Here, the input signal IS, the pre-distorted signal PDS, and the output signal OS may be digital signals. The pre-distortion circuit 100 may be modeled using a polynomial expression shown in Equation 1. In Equation 1, x(n) denotes a sample of the input signal IS, z(n) denotes a sample of the pre-distorted signal PDS, $a_q$ denotes a coefficient used for the pre-distortion of the input signal IS, and Q denotes a nonlinear order.

$$z(n)=\Sigma_{q=0}^{Q-1} a_q x(n)|x(n)|^q \qquad (1)$$

Figure 3:
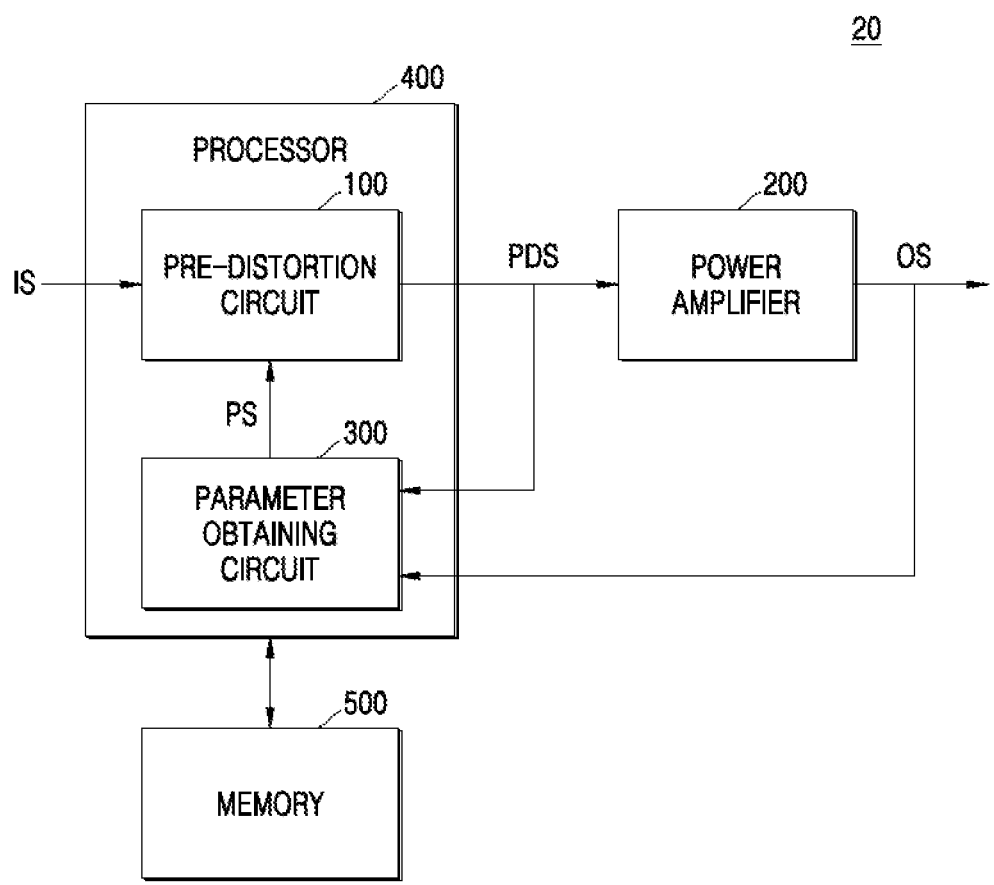
FIG. 3 is a diagram of a device according to an example embodiment.

The pre-distortion circuit 100 may be implemented in various forms. According to an embodiment, the pre-distortion circuit 100 may be implemented by hardware or software. When the pre-distortion circuit 100 is implemented by hardware, the pre-distortion circuit 100 may include circuits configured to pre-distort the input signal IS. For example, when the pre-distortion circuit 100 is implemented by software, as shown in FIG. 3, programs and/or instructions loaded in a memory 500 may be executed by a processor 400 or an arbitrary processor of the device 10 to perform the pre-distortion. However, the present disclosure is not limited thereto, and the pre-distortion circuit 100 may be implemented by a combination (e.g., firmware) of software and hardware.

The parameter obtaining circuit 300 may obtain the parameter set PS based on the pre-distorted signal PDS and the output signal OS and provide the obtained parameter set PS to the pre-distortion circuit 100.

In an embodiment, the parameter obtaining circuit 300 may obtain a parameter set PS, including a plurality of coefficients based on an indirect training structure. The indirect training structure may refer to a learning structure. The learning structure minimizes a difference between an intermediate signal obtained from the output signal OS and the pre-distorted signal PDS instead of minimizing a difference between the input signal IS and the output signal OS. Assuming that y(n) denotes a sample of the output signal OS, w(n) denotes a sample of the intermediate signal, $a_{kq}$ denotes a coefficient, Q denotes a nonlinear order, and K denotes a memory depth, the intermediate signal may denote a signal obtained using a polynomial expression shown in Equation 2:

$$w(n)=\Sigma_{k=0}^{K-1}\Sigma_{q=0}^{Q-1} a_{kq} y(n-k)|y(n-k)|^q \qquad (2)$$

The parameter obtaining circuit 300 may obtain the parameter set PS. Based on the indirect training structure, the parameter set PS may reduce the difference between the intermediate signal obtained from the output signal OS and the pre-distorted signal PDS. In an embodiment, the parameter obtaining circuit 300 may obtain a parameter set PS for minimizing a mean squared error MSE between the intermediate signal and the pre-distorted signal PDS. Assuming that z(n) denotes a sample of the pre-distorted signal PDS, w(n) denotes a sample of the intermediate signal, and e(n) denotes a sample of the error signal, the mean squared error MSE may be obtained by Equation 3:

$$\text{MSE}=E[e^2(n)]=E[|z(n)-w(n)|^2] \qquad (3)$$

A problem of obtaining coefficients $a_{kq}$ that minimizes the mean squared error MSE may be solved using a Wiener filter. In other words, the parameter obtaining circuit 300 may use the Wiener filter and obtain the parameter set PS including the coefficients $a_{kq}$ that minimizes the mean squared error MSE. In cases where the Wiener filter is applied, the problem of obtaining the coefficients that minimize the mean squared error MSE may be equivalent to a problem of solving a matrix equation shown in Equation 4. In Equation 4, y(n) denotes a sample of the output signal OS, z(n) denotes a sample of the pre-distorted signal PDS, Q denotes a nonlinear order, and K denotes a memory depth.

$$Ax = b \qquad (4)$$

$$A = E[Y(n)Y^H(n)], \; x = [a_{00} \; a_{01} \; a_{02} \; ... \; a_{K-1Q-1}]^T, \; b = E[Y(n)z^H(n)],$$

$$Y(n) = \begin{bmatrix} y(n), \; y(n)|y(n)|, \; , \; ..., \; y(n)|y(n)|^{Q-1}, \; y(n-1), \; ..., \\ y(n-K+1)|y(n-K+1)|^{Q-1} \end{bmatrix}^T$$

In Equation 4, a matrix with a superscript T may denote a transpose matrix. A matrix with a superscript H may denote a Hermitian matrix in which a number of elements of the matrix are conjugated and then transposed. In other words, the matrix with the superscript H may denote a conjugate transpose matrix. E[ ] may denote an expectation of a value in square brackets. In addition, Y(n) is a KQ×1 matrix in which an element corresponding to an i*j-th row and a first column has a value shown in Equation 5:

$$Y(n)[i*j,1]=y(n-i+1)|y(n-i+1)|^{j-1} \qquad (5)$$

Also, x may be a KQ×1 matrix, including coefficients. In the matrix x, an element corresponding to an i*j-th row and a first column may have a value shown in Equation 6:

$$x[i*j,1]=a_{(i-1)(j-1)} \qquad (6)$$

As a result, matrix A used in a method of applying a Wiener filter may be a KQ×KQ matrix, and matrix b may be a KQ×1 matrix. In other words, matrix b may be a vector having KQ elements. In an example method of applying the Wiener filter to Equation 4, matrix A used in an equation matrix equation will be referred to as an auto-correlation matrix, and matrix b will be referred to as a cross-correlation vector. Also, matrix x, including coefficients, will be referred to as a coefficient matrix. In other words, obtaining the parameter set, PS may include obtaining a coefficient matrix CM by obtaining a solution of the matrix equation shown in Equation 4.

The parameter obtaining circuit 300 may obtain the auto-correlation matrix A based on the output signal OS, and obtain the cross-correlation vector b based on the output signal OS and the pre-distorted signal PDS.

A parameter obtaining circuit may perform an operation of multiplying an inverse matrix of an auto-correlation matrix by a cross-correlation vector to obtain a coefficient matrix x. In this case, when a matrix size of the auto-correlation matrix is increased, a large number of operations may be used to obtain the inverse matrix of the auto-correlation matrix.

The parameter obtaining circuit 300 according to the example embodiment may obtain the coefficient x due to an iterative approximation operation. For example, the parameter obtaining circuit 300 may set an initial coefficient matrix and iteratively perform an operation of updating a coefficient matrix and a residue. Additionally, the parameter obtaining circuit 300 may stop iterating the operation when the residue is less than or equal to a critical value, and output a final updated coefficient matrix as the parameter set PS. In an embodiment, the parameter obtaining circuit 300 may obtain a coefficient matrix x, which satisfies Equation 4, by using a conjugate gradient method. A process of obtaining the coefficient matrix using the iterative approximation operation or the conjugate gradient method will be described in further detail with reference to the following drawings. As used herein, the conjugate gradient method may be referred to as a conjugate gradient method.

The parameter obtaining circuit 300, according to the example embodiment, may generate the parameter set PS. The parameter obtaining circuit 300 considers real-time changing characteristics of the output signal OS and the pre-distorted signal PDS to generate the parameter set PS. In other words, the parameter obtaining circuit 300 may update an auto-correlation matrix and a cross-correlation vector. Additionally, the parameter obtaining circuit 300 may obtain the parameter set PS based on the updated auto-correlation matrix and the updated cross-correlation vector. The auto-correlation matrix and cross-correlation vector update is based on an output signal OS and a pre-distorted signal PDS, which changes in real-time.

The parameter obtaining circuit 300 may be implemented in various forms. According to an embodiment, the parameter obtaining circuit 300 may be implemented by hardware or software. When the parameter obtaining circuit 300 is implemented by hardware, the parameter obtaining circuit 300 may include circuits configured to generate the parameter set PS based on the output signal OS and the pre-distorted signal PDS. In addition, for example, when the parameter obtaining circuit 300 is implemented by software, as shown in FIG. 2, programs and/or instructions loaded in the memory (refer to 500 in FIG. 2) may be executed by the processor (refer to 400 in FIG. 2) or an arbitrary processor of the device 10 to generate the parameter set PS. However, the present disclosure is not limited to the above-described embodiments, and the parameter obtaining circuit 300 may be implemented by a combination (e.g., firmware) of software and hardware.

In the device 10, according to the example embodiment, the nonlinearity of the power amplifier 200 included in the device 10 may be compensated for by the pre-distortion circuit 100. Thus, the reliability of wireless communication of the device 10 may be improved. Additionally, the number of operations may be reduced in the device 10, as compared to a case in which the parameter obtaining circuit 300 performs an inverse matrix operation. The number of operations may be reduced in device 10 because the parameter obtaining circuit 300 performs an iterative approximation operation and obtains the parameter set PS including coefficients. Furthermore, changes in characteristics of the power amplifier 200 and peripheral circuits thereof in device 10 may be reflected in real-time in the compensation for nonlinearity. According to the example embodiment, changes in characteristics of the power amplifier 200 and peripheral circuits thereof in device 10 occur because the parameter obtaining circuit 300 generates the parameter set PS based on the output signal OS and the pre-distorted signal PDS, which change in real-time.

FIG. 3 is a diagram of a device 20 according to an example embodiment. For example, FIG. 3 illustrates embodied examples of the pre-distortion circuit 100, the power amplifier 200, and the parameter obtaining circuit 300 shown in FIG. 1. The same descriptions of a pre-distortion circuit 100, a power amplifier 200, and a parameter obtaining circuit 300 of FIG. 3 as in FIG. 1 are omitted.

The device 20 may include a power amplifier 200, a processor 400, and a memory 500. The processor 400 may include a pre-distortion circuit 100 and a parameter obtaining circuit 300.

The processor 400 may control the overall operation of the device 10. For example, the processor 400 may include a central processing unit (CPU). The processor 400 may include a single-core processor or include a multi-core processor. The processor 400 may process or execute programs and/or data stored in the memory 500. In an embodiment, the processor 400 may execute programs stored in the memory 500 and control various functions of the device 10 or perform various operations.

The processor 400, according to an example embodiment, may pre-distort an input signal IS and generate a pre-distorted signal PDS. In an embodiment, the processor 400 may receive feedback on the pre-distorted signal PDS and an output signal OS. Additionally, the processor 400 may obtain a parameter set PS based on the pre-distorted signal PDS and the output signal OS. The processor 400 may also pre-distort the input signal IS based on the obtained parameter set PS.

To this end, in an embodiment, the parameter obtaining circuit 300 may generate an auto-correlation matrix based on the output signal OS and generate a cross-correlation vector based on the output signal OS and the pre-distorted signal PDS. The parameter obtaining circuit 300 may perform an iterative approximation operation using the auto-correlation matrix and the cross-correlation vector to obtain a coefficient matrix. Additionally, the parameter obtaining circuit 300 may provide the coefficient matrix as the parameter set PS to the pre-distortion circuit 100. In an embodiment, the parameter obtaining circuit 300 may obtain the coefficient matrix from the auto-correlation matrix and the cross-correlation vector by using a conjugate gradient method.

In an embodiment, the parameter obtaining circuit 300 may update an auto-correlation matrix and a cross-correlation vector based on an output signal OS and a pre-distorted signal PDS, which change in real-time. The parameter obtaining circuit 300 may perform an iterative approximation operation using the updated auto-correlation matrix and the updated cross-correlation vector. The parameter obtaining circuit 300 may then obtain a parameter set PS.

The memory 500, which is a storage site for storing data, may store, for example, an operating system (OS), various programs, and various pieces of data. The memory 500 may include at least one of a volatile memory or a non-volatile memory. The non-volatile memory may include read-only memory (ROM), programmable ROM (PROM), electrically programmable ROM (EPROM), electrically erasable and programmable ROM (EEPROM), flash memory, phase-change random access memory (PRAM), magnetic RAM (MRAM), resistive RAM (RRAM), and/or ferroelectric RAM (FRAM). The volatile memory may include dynamic RAM (DRAM), static RAM (SRAM), synchronous DRAM (SDRAM), PRAM, MRAM, RRAM, and/or FRAM. In an embodiment, the memory 500 may include at least one of a hard disk drive (HDD), a solid-state drive (SSD), a compact flash (CF) memory, a secure digital (SD) memory, a micro-SD memory, mini-SD, an extreme digital (xD) memory, or a memory stick. In an embodiment, the memory 500 may semi-permanently or temporarily store programs and a plurality of instructions, which are executed by the processor 400. In addition, the memory 500 may store various pieces of information or data used for calculations or operations of the processor 400.

Figure 4:
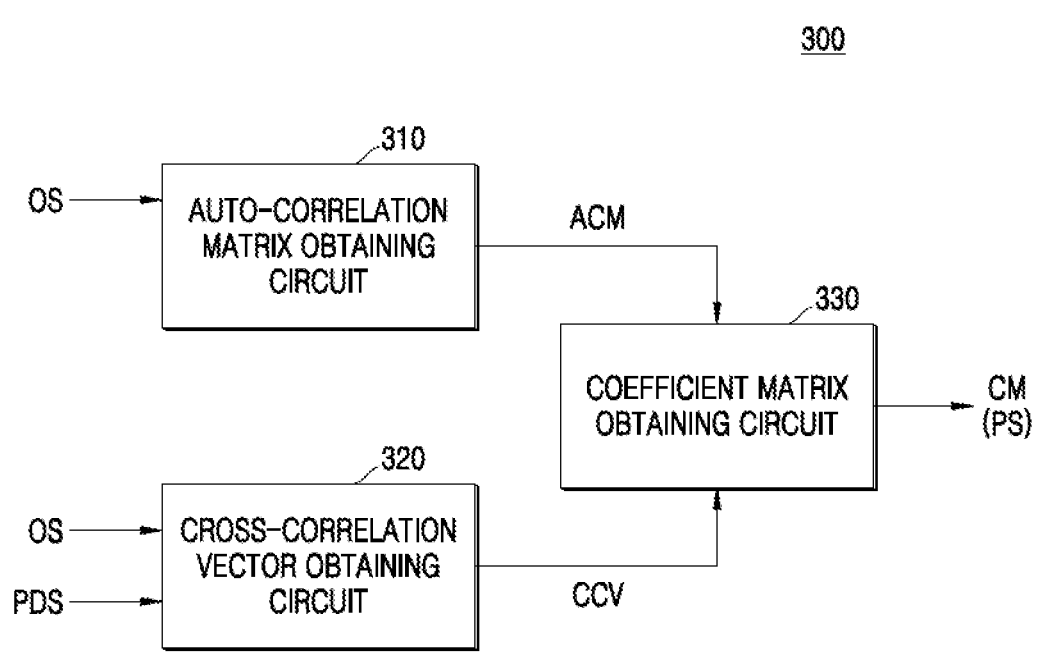
FIG. 4 is a diagram of a parameter obtaining circuit according to an example embodiment.

FIG. 4 is a diagram of a parameter obtaining circuit 300 according to an example embodiment. The parameter obtaining circuit 300 of FIG. 4 may correspond to the parameter obtaining circuit 300 of FIGS. 1 and 3.

The parameter obtaining circuit 300 may include an auto-correlation matrix obtaining circuit 310, a cross-correlation vector obtaining circuit 320, and a coefficient matrix obtaining circuit 330.

The auto-correlation matrix obtaining circuit 310 may generate an auto-correlation matrix ACM based on an output signal OS. In an embodiment, the output signal OS may be a digital signal. The auto-correlation matrix obtaining circuit 310 may obtain the auto-correlation matrix ACM. The auto-correlation matrix ACM is used for a matrix equation (e.g., Equation 4) that is equivalent to a problem of obtaining coefficients that minimize a difference between a pre-distorted signal PDS and an intermediate signal, by using the output signal OS. In other words, the auto-correlation matrix ACM may correspond to matrix A of Equation 4. The auto-correlation matrix obtaining circuit 310 may provide the auto-correlation matrix ACM to the coefficient matrix obtaining circuit 330.

The cross-correlation vector obtaining circuit 320 may generate a cross-correlation vector CCV based on the output signal OS and the pre-distorted signal PDS. In an embodiment, the output signal OS and the pre-distorted signal PDS may be digital signals. The cross-correlation vector obtaining circuit 320 may obtain the cross-correlation vector CCV. The cross-correlation vector CCV is used for a matrix equation (e.g., Equation 4) that is equivalent to the problem of obtaining the coefficients that minimize the difference between the pre-distorted signal PDS and the intermediate signal, by using the output signal OS and the pre-distorted signal PDS. In other words, the cross-correlation vector CCV may correspond to matrix b of Equation 4. The cross-correlation vector obtaining circuit 320 may provide the cross-correlation vector CCV to the coefficient matrix obtaining circuit 330.

The coefficient matrix obtaining circuit 330 may generate a coefficient matrix CM based on the auto-correlation matrix ACM and the cross-correlation vector CCV. The coefficient matrix obtaining circuit 330 may output the coefficient matrix CM as a parameter set PS. The parameter set PS may be provided to the pre-distortion circuit (refer to 100 in FIGS. 1 and 3).

The coefficient matrix obtaining circuit 330, according to an example embodiment, may obtain the coefficient matrix CM due to an iterative approximation operation. For example, the coefficient matrix obtaining circuit 330 may set an initial coefficient matrix and calculate a gradient vector using the initial coefficient matrix. Additionally, the coefficient matrix obtaining circuit 330 may update the coefficient matrix CM and a residue based on the calculated gradient vector. If a magnitude of the residue is less than or equal to a critical value, the coefficient matrix obtaining circuit 330 may output a final coefficient matrix as the parameter set PS. If the magnitude of the residue exceeds the critical value, the coefficient matrix obtaining circuit 330 may increase an iterative parameter and re-calculate a gradient vector. Additionally, the coefficient matrix obtaining circuit 330 may update a coefficient matrix and a residue again based on the re-calculated gradient vector. The above-described iteration operation is performed until the magnitude of the residue becomes less than or equal to the critical value, thereby generating the final coefficient matrix. The iterative approximation operation of the coefficient matrix obtaining circuit 330 may be understood more easily with reference to the following drawings, including FIGS. 5 and 6. In an embodiment, the coefficient matrix obtaining circuit 330 may obtain a coefficient matrix CM based on the auto-correlation matrix ACM and the cross-correlation vector CCV by using a conjugate gradient method.

Figure 5:
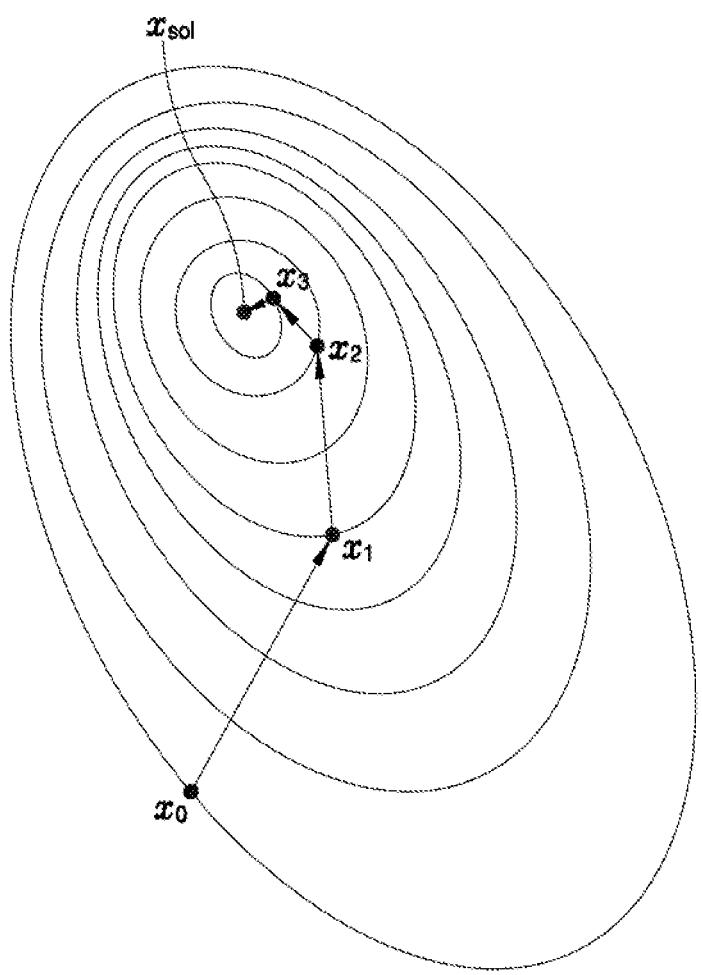
FIG. 5 is a conceptual diagram for explaining an iterative approximation operation according to an example embodiment.

FIG. 5 is a conceptual diagram for explaining an iterative approximation operation according to an example embodiment. For example, FIG. 5 is a diagram for explaining a method of finding solution $x_{sol}$, which illustrates contour lines of a residue.

Referring to FIG. 5 and Equation 4, a residue may refer to a difference between a result obtained by multiplying an arbitrary value x by matrix A and a value of matrix b. For example, assuming that r denotes the residue, A denotes an auto-correlation matrix, b denotes a cross-correlation vector, and $x_i$ denotes an arbitrary matrix, the residue may be obtained from Equation 7:

$$r = b - A x_i \tag{7}$$

In other words, in Equation 7, the closer r is a zero vector, the closer xi may be to the solution $x_{sol}$.

Referring to FIGS. 4 and 5, the coefficient matrix obtaining circuit 330 according to an example embodiment may set an initial coefficient matrix $x_0$.

The coefficient matrix obtaining circuit 330 may calculate a gradient vector based on the initial coefficient matrix $x_0$ and update a coefficient matrix based on the calculated gradient vector. Additionally, the coefficient matrix obtaining circuit 330 may obtain a second coefficient matrix $x_1$. Also, the coefficient matrix obtaining circuit 330 may also update a residue based on the calculated gradient vector. The coefficient matrix obtaining circuit 330 may compare a magnitude of the updated residue with a critical value.

When the magnitude of the residue exceeds the critical value, the coefficient matrix obtaining circuit 330 may calculate a gradient vector again based on the second coefficient matrix $x_1$ and update a coefficient matrix based on the calculated gradient vector. Additionally, the coefficient matrix obtaining circuit 330 may obtain a third coefficient matrix $x_2$. Also, the coefficient matrix obtaining circuit 330 may update a residue based on the calculated gradient vector. The coefficient matrix obtaining circuit 330 may compare the magnitude of the updated residue with the critical value.

When the magnitude of the residue exceeds the critical value, the coefficient matrix obtaining circuit 330 may calculate a gradient vector again based on the third coefficient matrix $x_2$ and update a coefficient matrix based on the calculated gradient vector. Additionally, the coefficient matrix obtaining circuit 330 may obtain a fourth coefficient matrix $x_3$. Furthermore, the coefficient matrix obtaining circuit 330 may update the residue based on the calculated gradient vector. The coefficient matrix obtaining circuit 330 may compare a magnitude of the updated residue with the critical value.

When the magnitude of the residue exceeds the critical value, the coefficient matrix obtaining circuit 330 may calculate a gradient vector again based on the fourth coefficient matrix $x_3$ and update a coefficient matrix based on the calculated gradient vector. Additionally, the coefficient matrix obtaining circuit 330 may obtain a final coefficient matrix equal to or extremely similar to the solution $x_{sol}$. Also, the coefficient matrix obtaining circuit 330 may update a residue based on the calculated gradient vector. The coefficient matrix obtaining circuit 330 may compare a magnitude of the updated residue with a critical value.

When the magnitude of the residue is equal to the critical value or less, the coefficient matrix obtaining circuit 330 may output the final coefficient matrix as a parameter set PS.

It will be understood that specific numbers, such as the number of iterations, in the above description, are exemplary.

The coefficient matrix obtaining circuit 330, according to the example embodiment, may obtain the final coefficient matrix equal to or extremely similar to the solution $x_{sol}$ due to the above-described iterative approximation operation. The coefficient matrix obtaining circuit 330, according to the example embodiment, may perform the iterative approximation operation instead of an inverse matrix operation and dramatically reduce the number of operations. Thus, overhead used for the pre-distortion of a device, including a coefficient matrix obtaining circuit 330, may be reduced.

According to an embodiment of the present disclosure, a method of wireless communication is described comprising identifying an input signal; performing a plurality of iterative approximations based on the input signal to generate a coefficient matrix; performing pre-distortion on the input signal based on the coefficient matrix to produce a predistorted signal; amplifying the predistorted signal based to produce an amplified signal; and transmitting the amplified signal.

In some embodiments, each of the plurality of iterative approximations further comprises identifying an approximate coefficient matrix; identifying an auto-correlation matrix; identifying a cross-correlation vector; computing a residue based on the approximate coefficient matrix, the auto-corrleation matrix, and the cross-correlation vector; and comparing the residue to a threshold value. In some cases, the method comprises determining that the residue exceeds the threshold value; computing a gradient vector based on the approximate coefficient matrix; and updating the approximate coefficient matrix based on the gradient vector. In some cases, the method comprises determining that the residue does not exceed the threshold value; and setting the coefficient matrix equal to the approximate coefficient matrix.

Figure 6A:
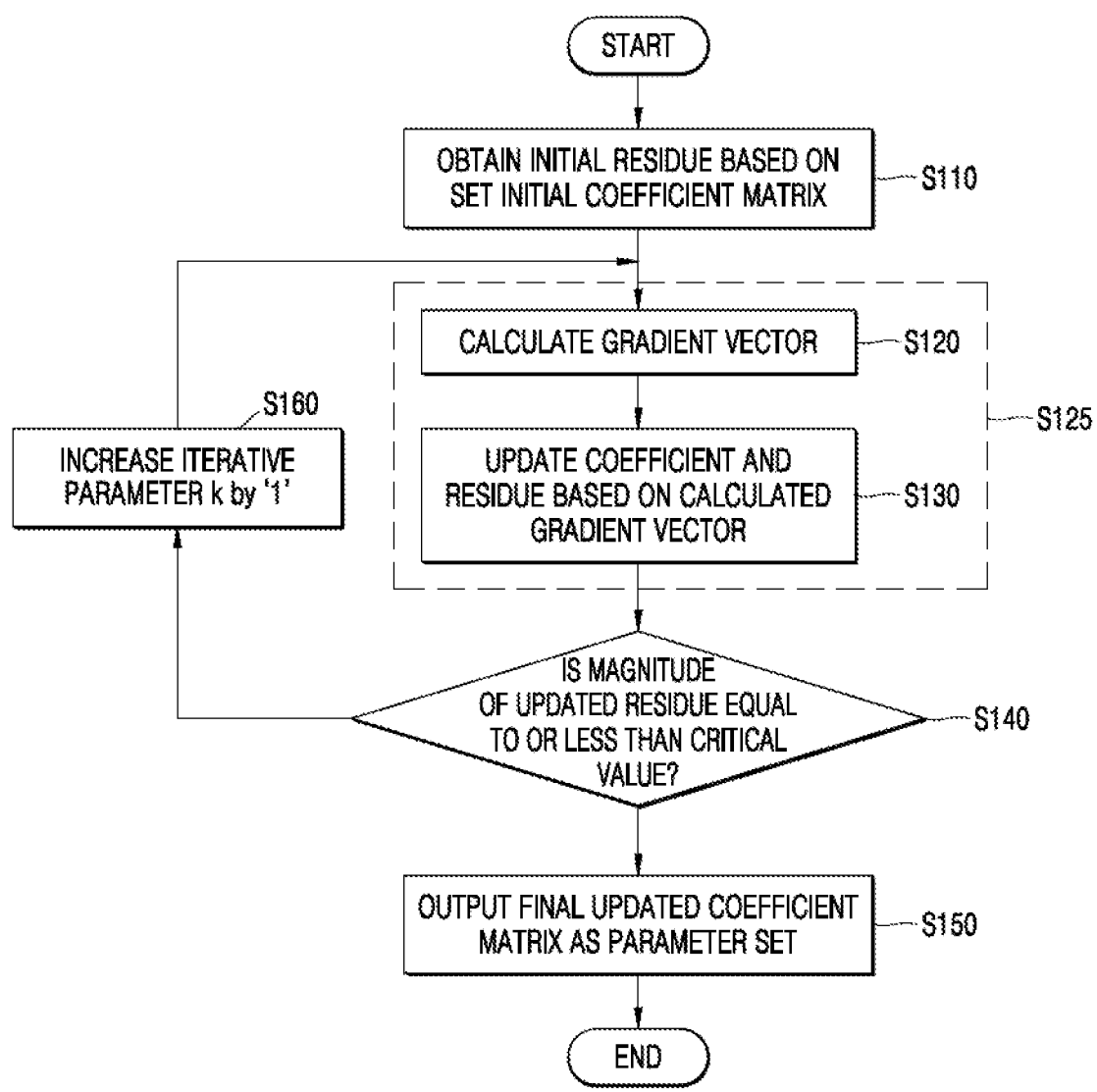
FIG. 6A is a flowchart illustrating a method of operating a device, according to an example embodiment.

FIG. 6A is a flowchart illustrating a method of operating a device 10, according to an example embodiment. For example, FIG. 6A illustrates an iterative approximation operation of the device. FIG. 6B shows an equation for each operation used in an iterative approximation operation of a device according to an example embodiment.

The flowchart of FIG. 6A will be described with reference to FIGS. 1, 4, and 6B. The device 10 may set an initial coefficient matrix and obtain an initial residue based on the set initial coefficient matrix (S110). For example, the coefficient matrix obtaining circuit 330, included in the parameter obtaining circuit 300, may set an initial coefficient matrix $x_0$, line (1) of FIG. 6B, and obtain an initial residue $r_0$. The initial residue $r_0$ may be obtained by applying Equation 7 to the set initial coefficient matrix x_0, the auto-correlation matrix ACM or A, and the cross-correlation vector CCV or b as in line (2) of FIG. 6B. In an embodiment, as in line (3) of FIG. 6B, when the initial residue $r_0$ is a critical value or less, the coefficient matrix obtaining circuit 330 may output the initial coefficient matrix $x_0$ as a parameter set PS. In an embodiment, as in lines (4) and (5) of FIG. 6B, an initial intermediate parameter P_0 may be set to the same value as the initial residue $r_0$, and an iterative parameter k may be initialized to '0.'

The device 10 may calculate a gradient vector $\alpha_k$ (S120). For example, the coefficient matrix obtaining circuit 330 included in the parameter obtaining circuit 300 may calculate the gradient vector $\alpha_k$ using a residue $r_k$, an auto-correlation matrix A, and an intermediate parameter $P_k$ as in line (7) of FIG. 6B.

The device 10 may update a coefficient matrix CM and a residue $r_k$ based on the calculated gradient vector $a_k$ (S130). For example, the coefficient matrix obtaining circuit 330 included in the parameter obtaining circuit 300 may update a coefficient matrix based on the calculated gradient vector $a_k$ and the intermediate parameter $P_k$ as in line (8) of FIG. 6B and update the residue $r_k$ based on the calculated gradient vector $\alpha_k$, the auto-correlation matrix A, and an intermediate parameter r_k as in line (9) of FIG. 6B.

The device 10 may determine whether a magnitude of an updated residue $r_{k+1}$ is less than or equal to a critical value (S140). For example, when the magnitude of the updated residue $r_{k+1}$ is less than or equal to the critical value, the coefficient matrix obtaining circuit 330 included in the parameter obtaining circuit 300 may terminate an iterated loop as in line (10) of FIG. 6B and proceed to operation S150. When the magnitude of the updated residue $r_{k+1}$ exceeds the critical value, the coefficient matrix obtaining circuit 330 may update the intermediate parameter $P_k$ as in line (11) and line (12) of FIG. 6B and proceed to operation S160.

When the magnitude of the updated residue $r_{k+1}$ exceeds the critical value, the device 10 may increase the iterative parameter k by '1.' (S160). For example, the coefficient matrix obtaining circuit 330 included in the parameter obtaining circuit 300 may increase the iterative parameter k by '1' as in line (13) of FIG. 6B. Subsequently, the device 10 may iteratively perform operations S120 and S130 until the magnitude of the updated residue $r_{k+1}$ is less than or equal to the critical value. Operations S120 and S130 will be inclusively referred to as a gradient-based approximation operation S125. In other words, between lines (6) and (14) of FIG. 6B, device 10 may iterate the gradient-based approximation operation S125.

When the magnitude of the updated residue $r_{k+1}$ is equal to the critical value or less, the device 10 may complete the gradient-based approximation operation S125 and output a final updated coefficient matrix $x_{k+1}$ as the parameter set PS. For instance, the coefficient matrix obtaining circuit 330 included in the parameter obtaining circuit 300 may output a final updated coefficient matrix x_k+1 as the parameter set PS as in line (15) of FIG. 6B.

Figure 7:
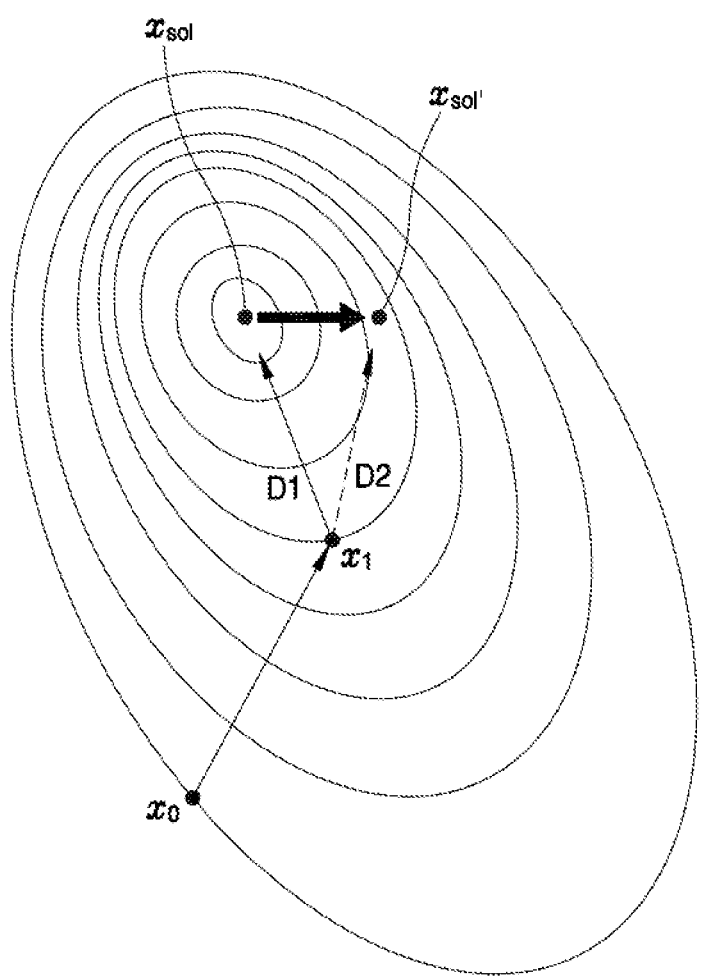
FIG. 7 is a conceptual diagram for explaining an iterative approximation operation according to an example embodiment.

FIG. 7 is a conceptual diagram for explaining an iterative approximation operation according to an example embodiment. For example, FIG. 7 is a diagram for explaining a method of finding solution $x_{sol}$, which illustrates contour lines of a residue. FIG. 7 will be described with reference to FIG. 1.

Referring to FIG. 7, solution $x_{sol}$ may be changed into a changed solution $x_{sol}'$ due to various factors in the device 10. For example, characteristics of the power amplifier 200 in device 10 may change over time due to variations in various factors, such as temperature or durability. With the changes in the characteristics of the power amplifier 200, a solution $x_{sol}$ used by parameter obtaining circuit 300 may also be changed into a changed solution $x_{sol}'$. However, the present disclosure is not limited thereto, and solution $x_{sol}$ may be changed into a changed solution $x_{sol}'$ due to variations in characteristics of another component (e.g., the pre-distortion circuit 100 or the parameter obtaining circuit 300) in the device 10. For example, it is assumed that solution $x_{sol}$ is changed into a solution $x_{sol}'$ at a time point when the parameter obtaining circuit 300 obtains a second coefficient matrix $x_1$ due to one gradient-based approximation operation based on an initial coefficient matrix X0. In this case, the parameter obtaining circuit 300 may approximate a coefficient matrix in a second direction D2 instead of approximating the coefficient matrix in a first direction D1.

To this end, the parameter obtaining circuit 300, according to the example embodiment, may update an auto-correlation matrix and a cross-correlation vector based on an output signal OS and a pre-distorted signal PDS, which change in real-time. Additionally, the parameter obtaining circuit 300 may perform an iterative approximation operation based on the updated auto-correlation matrix and the updated cross-correlation vector, to obtain a final coefficient matrix. A method of obtaining a coefficient matrix based on characteristics, which change in real-time, will be described below in further detail with reference to FIGS. 8 to 11.

Figure 8:
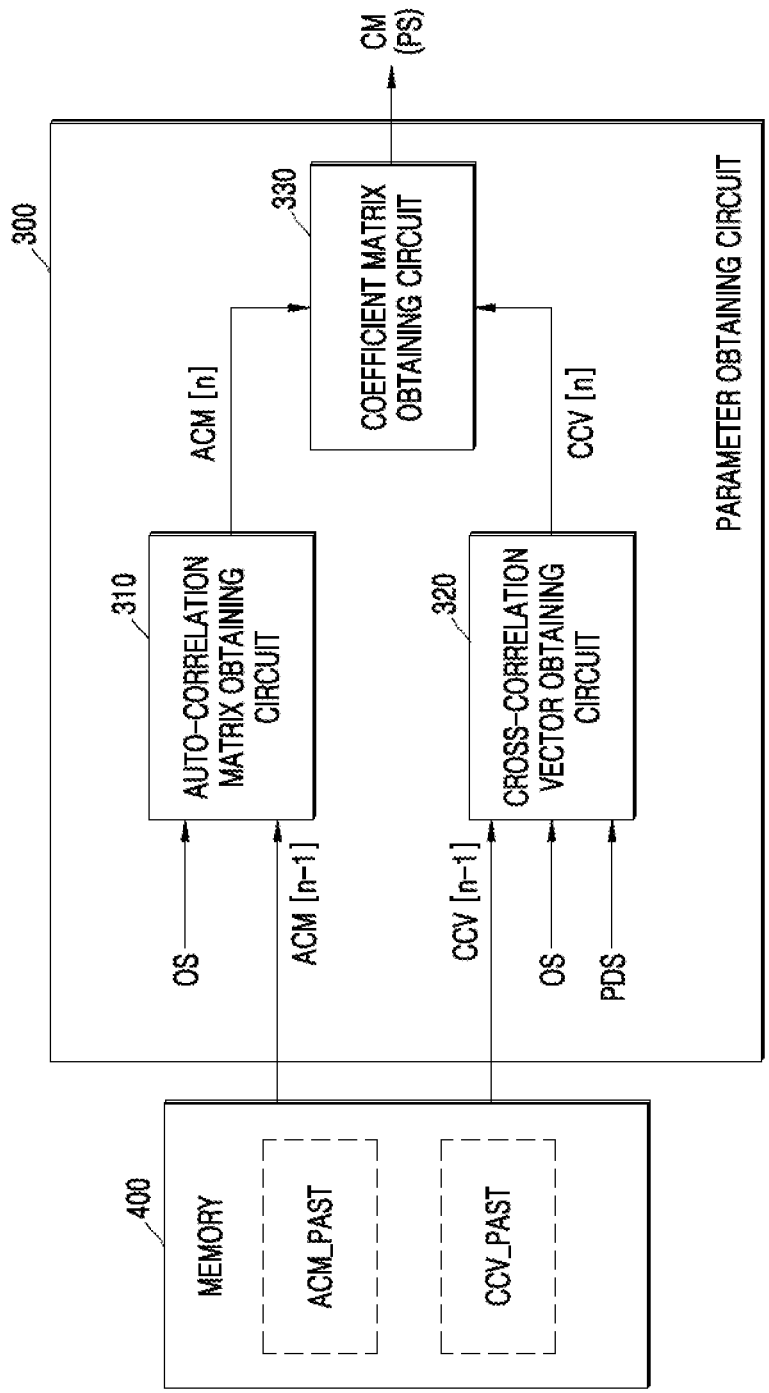
FIG. 8 is a diagram of a parameter obtaining circuit and a memory according to an example embodiment.

FIG. 8 is a diagram of a parameter obtaining circuit 300 and a memory 500 according to an example embodiment. The parameter obtaining circuit 300 may include an auto-correlation matrix obtaining circuit 310, a cross-correlation vector obtaining circuit 320, and a coefficient matrix obtaining circuit 330.

The memory 500 may store a past auto-correlation matrix ACM PAST, which is obtained at a past time point, and a past cross-correlation vector CCV PAST, which is obtained at the past time point. For example, assuming that a time sample corresponding to a current time point is 'n,' the memory 500 may store an auto-correlation matrix ACM[n−1]. The auto-correlation matrix ACM[n−1] may correspond to an immediately previous time sample and a cross-correlation vector CCV[n−1] corresponding to the immediately previous time sample. The memory 500 may provide the auto-correlation matrix ACM[n−1] corresponding to the immediately previous time sample to the auto-correlation matrix obtaining circuit 310. The memory 500 may also provide the cross-correlation vector CCV[n−1] corresponding to the immediately previous time sample to the cross-correlation vector obtaining circuit 320.

The coefficient matrix obtaining circuit 330, according to an example embodiment, may obtain a coefficient matrix CM based on an auto-correlation matrix and a cross-correlation vector. For example, the coefficient matrix obtaining circuit 330 may obtain the coefficient matrix CM based on an auto-correlation matrix, which changes over time, and a cross-correlation vector, which changes over time. In other words, the coefficient matrix obtaining circuit 330 may obtain the coefficient matrix CM based on an auto-correlation matrix ACM[n] corresponding to a current time point and a cross-correlation vector CCV[n] corresponding to the current time point. The auto-correlation matrix ACM[n], corresponding to the current time point, may be provided by the auto-correlation matrix obtaining circuit 310. The cross-correlation vector CCV[n] corresponding to the current time point may be provided by the cross-correlation vector obtaining circuit 320.

In an embodiment, the coefficient matrix obtaining circuit 330 may perform an iterative approximation operation using an auto-correlation matrix and a cross-correlation vector, and obtain the coefficient matrix CM. Both the an auto-correlation matrix and cross-correlation vector are updated over time.

The auto-correlation matrix obtaining circuit 310 may generate the auto-correlation matrix ACM[n] corresponding to the current time point based on an output signal OS and the auto-correlation matrix ACM[n−1] corresponding to the immediately previous time sample. In other words, the auto-correlation matrix obtaining circuit 310 may update an auto-correlation matrix based on an output signal OS, which changes over time, and provide the updated auto-correlation matrix to the coefficient matrix obtaining circuit 330. In an embodiment, the auto-correlation matrix obtaining circuit 310 may calculate an average weight value using a temporary auto-correlation matrix and the auto-correlation matrix ACM[n−1] corresponding to the immediately previous time sample. The auto-correlation matrix obtaining circuit 310 may then obtain the auto-correlation matrix ACM[n] corresponding to the current time point. The temporary auto-correlation matrix is obtained based on the output signal OS.

For example, assuming that 'u' denotes a weight value, the auto-correlation matrix obtaining circuit 310 may obtain the auto-correlation matrix ACM[n] corresponding to the current time point from Equation 8. Y(n) may be a value obtained based on the output signal OS and may be obtained in the same way as Y(n) of Equation 4, and E[Y(n)Y^H(n)] may denote a temporary auto-correlation matrix.

$$ACM[n]=u \cdot ACM[n-1]+(1-u) \cdot E[Y(n)Y^H(n)] \qquad (8)$$

wherein a weight value u may denote an arbitrary real number greater than or equal to 0 and less than or equal to 1. In an embodiment, the weight value v may be a predetermined value. In another embodiment, the weight value v may be a value that may be changed by a system.

It may be possible to degrade the stability of the auto-correlation matrix ACM[n] when the auto-correlation matrix obtained based on the output signal OS is used as the auto-correlation matrix ACM[n] corresponding to the current time point, since an auto-correlation matrix obtained based on the output signal OS is obtained in real-time. In the example embodiment, the auto-correlation matrix obtaining circuit 310 may calculate an average weight value using an auto-correlation matrix ACM[n−1] corresponding to an immediately previous time point. The auto-correlation matrix obtaining circuit 310 may also calculate the temporary auto-correlation matrix obtained based on the output signal OS and obtain the auto-correlation matrix ACM[n] corresponding to the current time point. Thus, a stable auto-correlation matrix may be generated.

The cross-correlation vector obtaining circuit 320 may generate the cross-correlation vector CCV[n]. The cross-correlation vector CCV[n] may correspond to the current time point based on the output signal OS a pre-distorted signal PDS and the cross-correlation vector CCV[n−1] corresponding to the immediately previous time sample. In other words, the cross-correlation vector obtaining circuit 320 may update a cross-correlation vector based on the output signal OS and the pre-distorted signal PDS, which change over time. The cross-correlation vector obtaining circuit 320 may also provide the updated cross-correlation vector to the coefficient matrix obtaining circuit 330. In an embodiment, the cross-correlation vector obtaining circuit 320 may calculate an average weight value. The average weight value is calculated using a temporary cross-correlation vector, which is obtained based on the output signal OS and the pre-distorted signal PDS, and the cross-correlation vector CCV[n−1] corresponding to the immediately previous time sample and obtain the cross-correlation vector CCV[n] corresponding to the current time point. For example, assuming that z(n) denotes a sample of the pre-distorted signal PDS and v denotes a weight value, the cross-correlation vector obtaining circuit 320 may obtain the cross-correlation vector CCV[n] corresponding to the current time point from Equation 9. Y(n) may be a value obtained based on the output signal OS and may be obtained in the same way as Y(n) of Equation 4, and E[Y(n)z^H(n)] may denote a temporary cross-correlation vector.

$$CCV[n]=v \cdot CCV[n-1]+(1-v) \cdot E[Y(n)z^H(n)] \qquad (9)$$

wherein a weight value v may denote an arbitrary real number greater than or equal to 0 and less than or equal to 1. In an embodiment, the weight value v may be a predetermined value. In another embodiment, the weight value v may be a value that may be changed by a system.

It may be possible to degrade the stability of the cross-correlation vector CCV[n] when the cross-correlation vector obtained based on the output signal OS and the pre-distorted signal PDS is used as the cross-correlation vector CCV[n] corresponding to the current time point, since a cross-correlation vector obtained based on the output signal OS and the pre-distorted signal PDS is obtained in real-time. In the example embodiment, the cross-correlation vector obtaining circuit 320 may calculate an average weight value. The average weight value is calculated using a cross-correlation vector CCV[n−1] corresponding to the immediately previous time point and a cross-correlation vector obtained based on the output signal OS and the pre-distorted signal PDS and obtain the cross-correlation vector CCV[n] corresponding to the current time point. Thus, a stable cross-correlation vector may be generated.

In the parameter obtaining circuit 300 and the memory 500 according to the example embodiment, the parameter obtaining circuit 300 may obtain the coefficient matrix CM using the output signal OS and the pre-distorted signal PDS, which change in real-time, and also, obtain the coefficient matrix CM based on a stable auto-correlation matrix and a stable cross-correlation vector.

Figure 9:
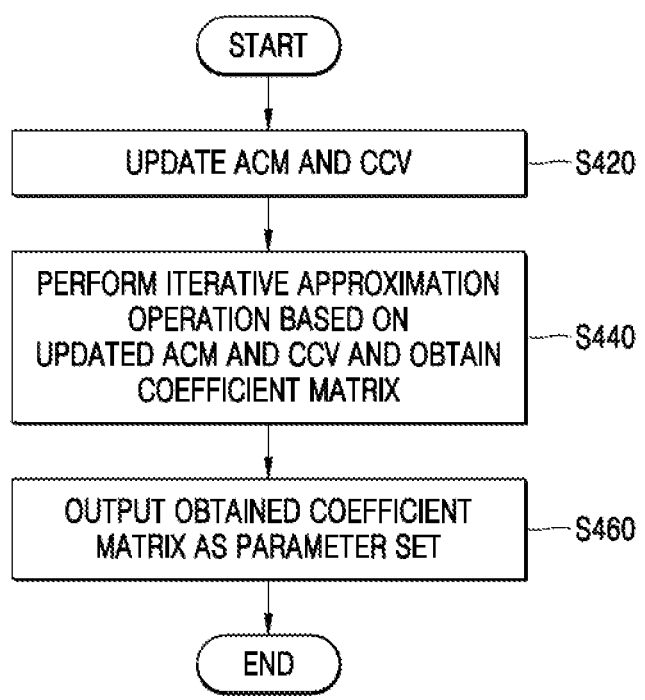
FIG. 9 is a flowchart illustrating a method of operating a device, according to an example embodiment.

FIG. 9 is a flowchart illustrating a method of operating a device, according to an example embodiment. The flowchart of FIG. 9 will be described with reference to FIG. 8.

The parameter obtaining circuit 300 may update an auto-correlation matrix ACM and a cross-correlation vector CCV based on an output signal OS, which changes over time. The parameter obtaining circuit 300 may also update a pre-distorted signal PDS, which changes over time (S220). For example, the auto-correlation matrix obtaining circuit 310 may obtain an auto-correlation matrix ACM[n] corresponding to a current time point based on the output signal OS, which changes over time, and an auto-correlation matrix ACM[n−1] corresponding to an immediately previous time sample. In another example, the cross-correlation vector obtaining circuit 320 may obtain a cross-correlation vector CCV[n] corresponding to the current time point based on the output signal OS, the pre-distorted signal PDS, and a cross-correlation vector CCV[n−1] corresponding to the immediately previous time sample. The current time point based on the output signal OS and the pre-distorted signal PDS change over time.

The parameter obtaining circuit 300 may perform an iterative approximation operation based on the updated auto-correlation matrix ACM and the updated cross-correlation vector CCV and obtain a coefficient matrix CM (S240). For example, the coefficient matrix obtaining circuit 330 may perform an iterative approximation operation based on the auto-correlation matrix ACM[n] corresponding to the current time point and the cross-correlation vector CCV[n] corresponding to the current time point and obtain a coefficient matrix CM. In an embodiment, the coefficient matrix obtaining circuit 330 may obtain a coefficient matrix CM by applying a conjugate gradient method to the auto-correlation matrix ACM[n] corresponding to the current time point and the cross-correlation vector CCV[n] corresponding to the current time point.

The parameter obtaining circuit 300 may output the obtained coefficient matrix CM as a parameter set PS. In an embodiment, the parameter obtaining circuit 300 may provide the obtained coefficient matrix CM as the parameter set PS to the pre-distortion circuit 100 of FIG. 1 or FIG. 3.

Figure 10:
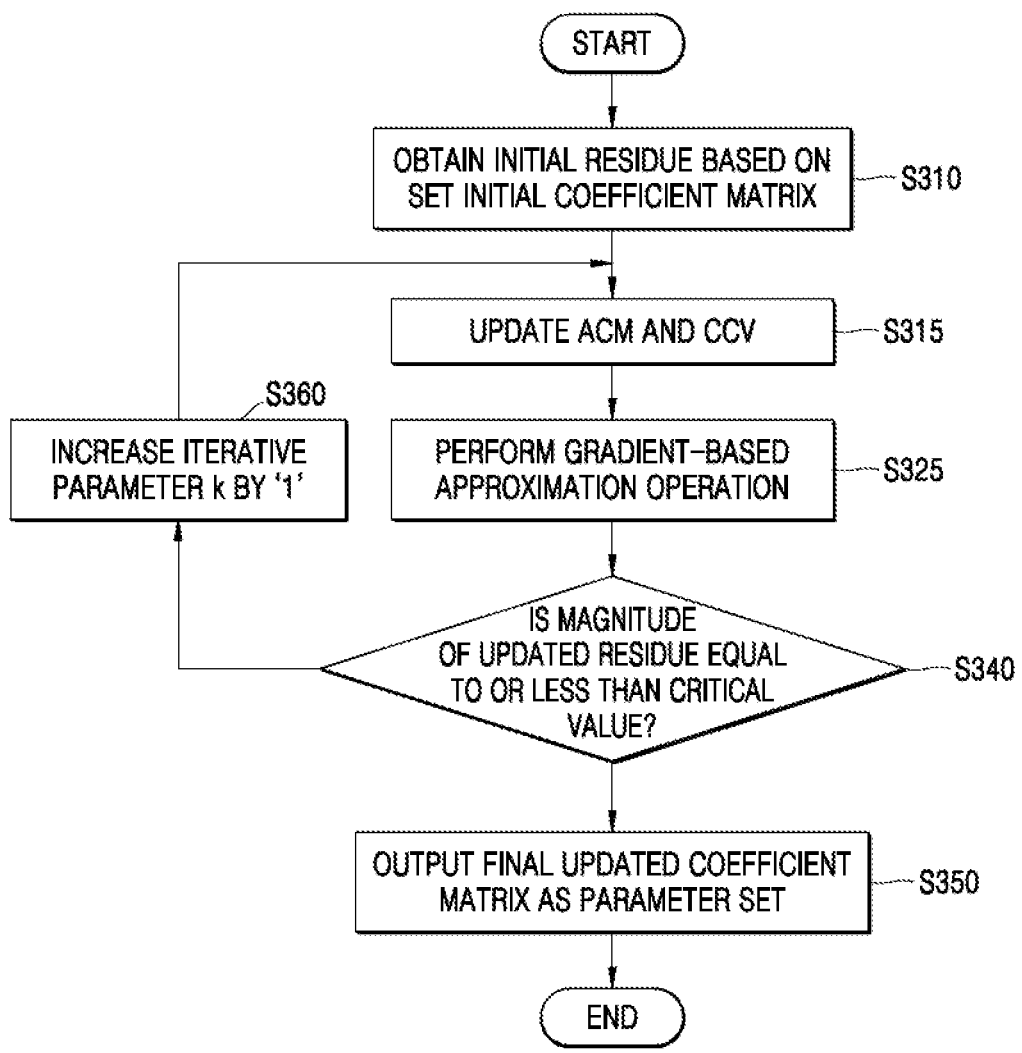
FIG. 10 is a flowchart illustrating a method of operating a device, according to an example embodiment.

FIG. 10 is a flowchart illustrating a method of operating a device 10 according to an example embodiment. For example, FIG. 10 illustrates an iterative approximation operation of device 10. The flowchart of FIG. 10 will be described with reference to FIGS. 1 and 8, and differences between FIGS. 6A and 10 will mainly be described.

The device 10 may set an initial coefficient matrix and obtain an initial residue based on the set initial coefficient matrix (S310). Operation S310 may correspond to the operation of FIG. 6A and repeated descriptions thereof are omitted.

The device 10 may update an auto-correlation matrix ACM and a cross-correlation vector CCV (S315). For example, a parameter obtaining circuit 300 may update the auto-correlation matrix ACM and the cross-correlation vector CCV based on an output signal OS and a pre-distorted signal PDS. Both the output signal OS and the pre-distorted signal PDS change over time. A method of updating the auto-correlation matrix ACM and updating the cross-correlation vector CCV may be understood in further detail with reference to the descriptions of FIG. 9 and operation S220 of FIG. 10.

The device 10 may perform a gradient-based approximation operation based on the updated auto-correlation matrix ACM and the updated cross-correlation vector CCV (S325). For example, the device 10 may calculate a gradient vector, based on the updated auto-correlation matrix ACM and the updated cross-correlation vector CCV, and update a coefficient matrix CM and a residue based on the calculated gradient vector. In other words, operation S325 may correspond to operation S125 of FIG. 6A and repeated descriptions thereof are omitted.

The device 10 may determine whether a magnitude of the updated residue is a critical value or less (S340). Operation S340 may correspond to operation S140 of FIG. 6A and repeated descriptions thereof are omitted.

When the magnitude of the updated residue exceeds the critical value, the device 10 may increase an iterative parameter k by '1.' (S360). Operation S360 may correspond to operation S160 of FIG. 6A and repeated descriptions thereof are omitted.

When the magnitude of the updated residue is equal to the critical value or less, the device 10 may end the gradient-based approximation operation S325 and output a final updated coefficient matrix as a parameter set PS (S350). Operation S350 may correspond to operation S150 of FIG. 6A and repeated description thereof is omitted.

In summary, in an embodiment, the device 10 may update the auto-correlation matrix ACM and the cross-correlation vector CCV whenever an iterative parameter k of the iterative approximation operation increases by '1'. Thus, the device 10 may obtain the parameter set PS in which changes in characteristics of the device 10 or the power amplifier 200 with respect to time are reflected. The device 10 may then perform pre-distortion based on the parameter set PS in which the changes in the characteristics are reflected, thereby increasing the performance or reliability of wireless communication of the device 10.

In an embodiment, the device 10 may update the auto-correlation matrix ACM and the cross-correlation vector CCV whenever the iterative parameter k of the iterative approximation operation increases by 'm' (here, m is a natural number equal to or greater than 2) greater than '1.' The present embodiment will be described below with reference to FIG. 11.

Figure 11:
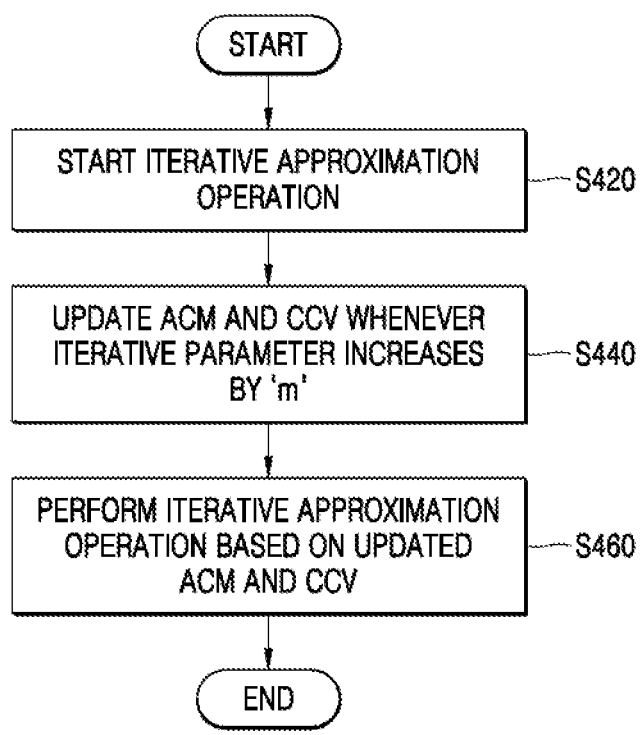
FIG. 11 is a flowchart illustrating a method of operating a device, according to an example embodiment.

FIG. 11 is a flowchart illustrating a method of operating a device, according to an example embodiment. The flowchart of FIG. 11 will be described with reference to FIGS. 1 and 8.

The device 10 may start an iterative approximation operation (S420). For example, to obtain a coefficient matrix CM, the parameter obtaining circuit 300 may start an iterative approximation operation based on an auto-correlation matrix ACM and a cross-correlation vector CCV. The iterative approximation operation may include a plurality of gradient-based approximation operations, which are iteratively performed until a magnitude of a residue becomes less than or equal to a critical value. The parameter obtaining circuit 300 may increase an iterative parameter by '1' whenever one gradient-based approximation operation is further performed.

The device 10 may update the auto-correlation matrix ACM and the cross-correlation vector CCV whenever the iterative parameter increases by 'm' (S440). Here, m may be 1. In some embodiments, m may be a predetermined value, which is an arbitrary natural number equal to or greater than 2. In other words, the device 10 may update the auto-correlation matrix ACM and the cross-correlation vector CCV whenever a gradient-based approximation operation is performed 'm' times. For example, the parameter obtaining circuit 300 may update the auto-correlation matrix ACM and the cross-correlation vector CCV based on an output signal OS and a pre-distorted signal PDS. Tnn output signal OS and the pre-distorted signal PDS change over time. A method of updating the auto-correlation matrix ACM and updating the cross-correlation vector CCV may be understood in further detail with reference to the descriptions of FIG. 9 and operation S220 of FIG. 10.

The device 10 may perform an iterative approximation operation based on the updated auto-correlation matrix ACM and the updated cross-correlation vector CCV (S460). For example, the device 10 may calculate a gradient vector when the auto-correlation matrix ACM and the cross-correlation vector CCV are updated. The calculation of the gradient vector is based on the updated auto-correlation matrix ACM and the updated cross-correlation vector CCV, and update the coefficient matrix CM and the residue based on the calculated gradient vector.

Figure 12:
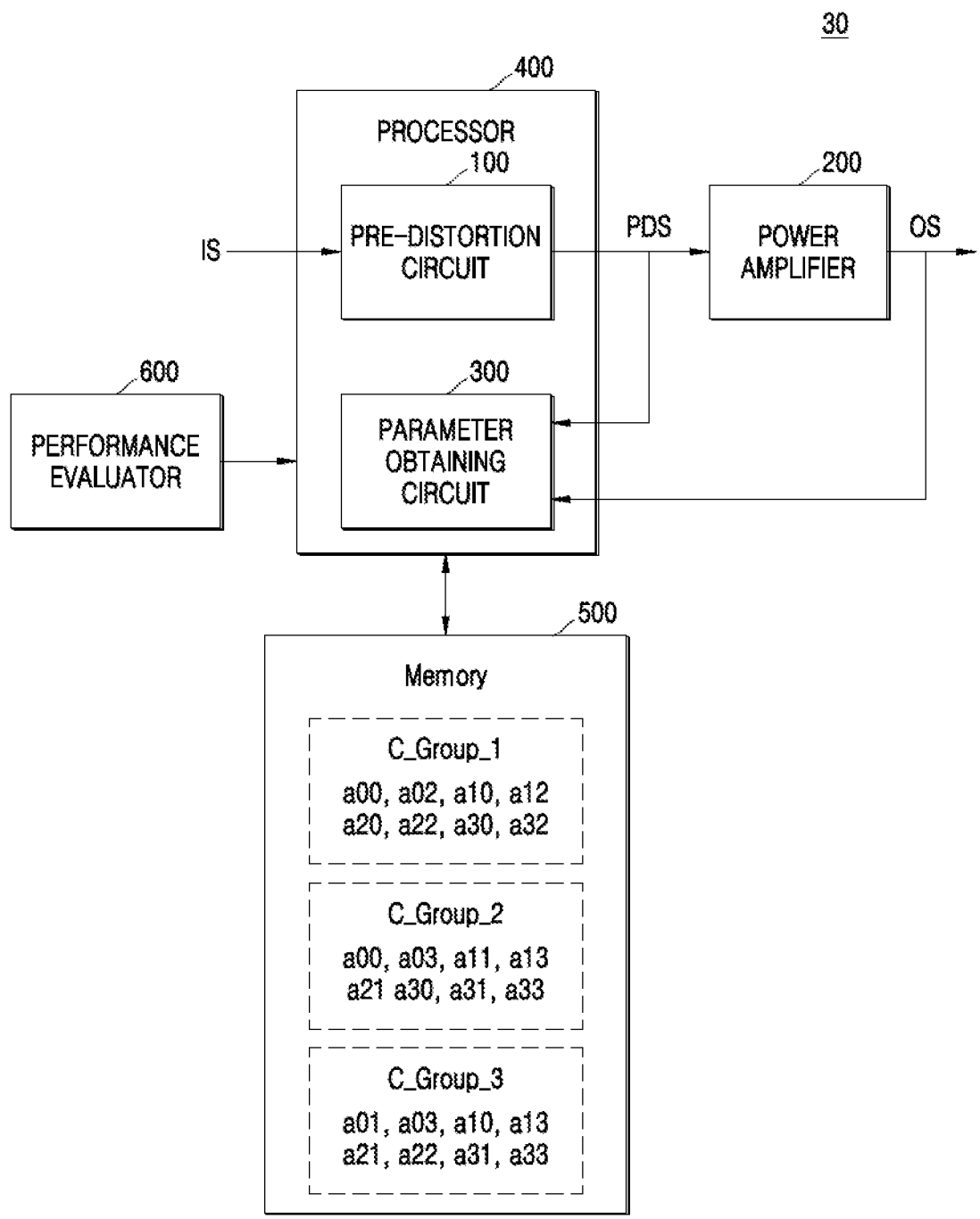
FIG. 12 is a diagram of a device according to an example embodiment.

FIG. 12 is a diagram of a device 30 according to an example embodiment. The same descriptions of a pre-distortion circuit 100, a power amplifier 200, and a parameter obtaining circuit 300 of FIG. 12 as in the device 10 of FIG. 1 and the device of FIG. 3 are omitted.

The device 30 may include a pre-distortion circuit 100, a power amplifier 200, a parameter obtaining circuit 300, a memory 500, and a performance evaluator 600. In an embodiment, the pre-distortion circuit 100 and the parameter obtaining circuit 300 may be implemented as software-driven by a processor 400.

Referring to the descriptions provided with reference to FIGS. 1 to 11, the number of coefficients used in the pre-distortion circuit 100 and the parameter obtaining circuit 300 may be determined by the memory depth K and the nonlinear order Q. For example, when the memory depth K is '4,' and the nonlinear order Q is '4,' 16 coefficients including a00 to a33 may be used for a pre-distortion operation. In other words, the number of used coefficients may be determined by a multiplication of the memory depth K by the nonlinear order Q. When the memory depth K or the nonlinear order Q is increased, the number of the used coefficients may increase, and thus, an operation speed may be reduced.

To this end, the pre-distortion circuit 100, according to the example embodiment, may perform the pre-distortion operation using a number of the coefficients. To this end, the memory 500 may store pieces of coefficient group information. The memory 500 may include first coefficient group information C_Group_1, second coefficient group information C_Group_2, and third coefficient group information C_Group_3, but the memory 500 is not limited thereto. An embodiment in which the first coefficient group information C_Group_1, the second coefficient group information C_Group_2, and the third coefficient group information C_Group_3 are used will be described on the assumption that the memory depth K is '4,' and the nonlinear order Q is '4.'

The first coefficient group information C_Group_1 may include information indicating that pre-distortion is performed using first coefficients a00, a02, a10, a12, a20, a22, a30, and a32. The number and types of the first coefficients are merely exemplary for brevity and may depend on an embodiment. The first coefficients a00, a02, a10, a12, a20, a22, a30, and a32 may be predetermined coefficients.

Similarly, the second coefficient group information C_Group_2 may include information indicating that pre-distortion is performed using second coefficients a00, a03, a11, a13, a21, a30, a31, and a33. The number and types of the second coefficients are merely exemplary for brevity and depend on an embodiment. The second coefficients a00, a03, a11, a13, a21, a30, a31, and a33 may be predetermined coefficients.

Similarly, the third coefficient group information C_Group_3 may include information indicating that pre-distortion is performed using third coefficients a01, a03, a10, a13, a21, a22, a31, and a33. The number and types of the third coefficients are merely exemplary for brevity and depend on an embodiment. The third coefficients a01, a03, a10, a13, a21, a22, a31, and a33 may be predetermined coefficients.

In an embodiment, the pre-distortion circuit 100 may perform a pre-distortion operation using some coefficients. For example, the pre-distortion circuit 100 may perform the pre-distortion operation using first coefficients a00, a02, a10, a12, a20, a22, a30, and a32 based on first coefficient group information C_Group_1. In this case, the parameter obtaining circuit 300 may provide a parameter set PS corresponding to the first coefficients a00, a02, a10, a12, a20, a22, a30, and a32 to the pre-distortion circuit 100.

The performance evaluator 600 may evaluate the performance of the device 30. For example, the performance evaluator 600 may evaluate power amplification performance based on an input signal IS and an output signal OS. For instance, the performance evaluator 600 may compare the input signal IS with the output signal OS and evaluate the power amplification performance. When the performance of the device 30 is less than or equal to critical performance, the performance evaluator 600 may control the processor 400 to change coefficients used in the pre-distortion circuit 100 and the parameter obtaining circuit 300. For example, the performance evaluator 600 may provide a control signal for changing a coefficient group to the processor 400.

For example, when the evaluated performance is less than or equal to the critical performance, the performance evaluator 600 may control the pre-distortion circuit 100 to perform a pre-distortion operation using second coefficients a00, a03, a11, a13, a21, a30, a31, and a33 based on second coefficient group information C_Group_2. In this case, the parameter obtaining circuit 300 may provide a parameter set PS corresponding to the second coefficients a00, a03, a11, a13, a21, a30, a31, and a33 to the pre-distortion circuit 100.

For example, similarly, when the evaluated performance is less than or equal to the critical performance, the performance evaluator 600 may control the pre-distortion circuit 100 to perform a pre-distortion operation using third coefficients a01, a03, a10, a13, a21, a22, a31, and a33 based on third coefficient group information C_Group_3. In this case, the parameter obtaining circuit 300 may provide a parameter set PS corresponding to the third coefficients a01, a03, a10, a13, a21, a22, a31, and a33 to the pre-distortion circuit 100.

The performance evaluator 600 may be implemented in various forms. According to an embodiment, the performance evaluator 600 may be implemented as hardware or software. When the performance evaluator 600 is implemented as hardware, the performance evaluator 600 may include circuits configured to evaluate the performance of the device 30. For example, when the performance evaluator 600 is implemented as software, programs, and/or instructions loaded in, the memory 500 may be executed by the processor 400 or an arbitrary processor of the device 10 to enable the evaluation of the performance. However, the present disclosure is not limited thereto, and the performance evaluator 600 may be implemented as a combination (e.g., firmware) of software and hardware.

Figure 13:
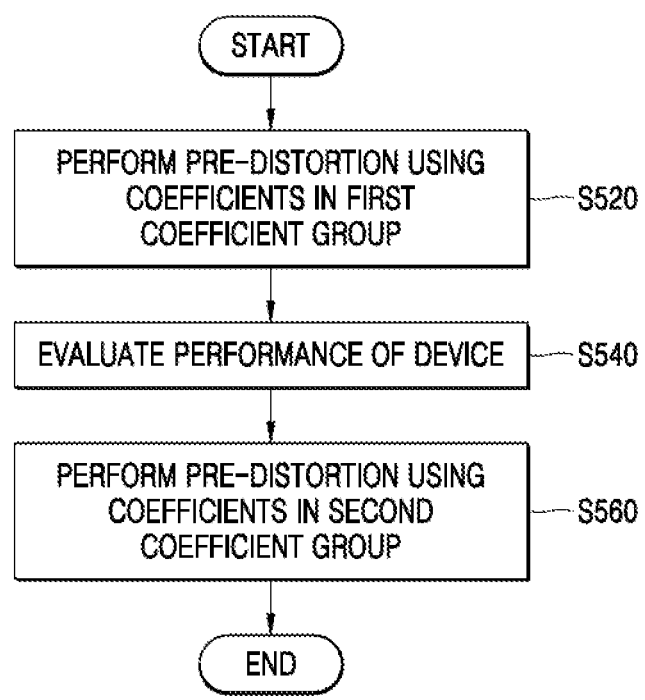
FIG. 13 is a flowchart illustrating a method of operating a device, according to an example embodiment.

FIG. 13 is a flowchart illustrating a method of operating a device, according to an example embodiment. For example, FIG. 13 illustrates a method of operating a device, according to an embodiment in which some of a plurality of coefficients are used. The flowchart of FIG. 13 will be described with reference to FIG. 12.

The device 30 may perform a pre-distortion operation using first coefficients a00, a02, a10, a12, a20, a22, a30, and a32 in a first coefficient group (S520). For example, the pre-distortion circuit 100 may perform the pre-distortion operation using the first coefficients a00, a02, a10, a12, a20, a22, a30, and a32 based on first coefficient group information C_Group_1. In an embodiment, the parameter obtaining circuit 300 may provide a parameter set PS including the first coefficients a00, a02, a10, a12, a20, a22, a30, and a32 to the pre-distortion circuit 100 based on the first coefficient group information C_Group_1.

The device 30 may evaluate performance thereof (S540). For example, the performance evaluator 600 may evaluate the performance of the device 30. When the evaluated performance is less than or equal to critical performance, the performance evaluator 600 may provide a control signal to the processor 400 to change coefficients used for the pre-distortion operation. The processor 400 may change the coefficients used for the pre-distortion operation into coefficients in another coefficient group.

For example, device 30 may perform a pre-distortion operation using second coefficients a00, a03, a11, a13, a21, a30, a31, and a33 in a second coefficient group (S560). For example, the pre-distortion circuit 100 may perform the pre-distortion operation using the second coefficients a00, a03, a11, a13, a21, a30, a31, and a33 based on second coefficient group information C_Group_2. In an embodiment, the parameter obtaining circuit 300 may provide a parameter set PS including the second coefficients a00, a03, a11, a13, a21, a30, a31, and a33 to the pre-distortion circuit 100 based on the second coefficient group information C_Group_2.

In the device 30, according to the example embodiment, the number of operations may be reduced by using some of the plurality of coefficients. A used coefficient group may be changed according to the performance of the device 30, thereby ensuring the reliability of wireless communication of the device 30.

Figure 14:
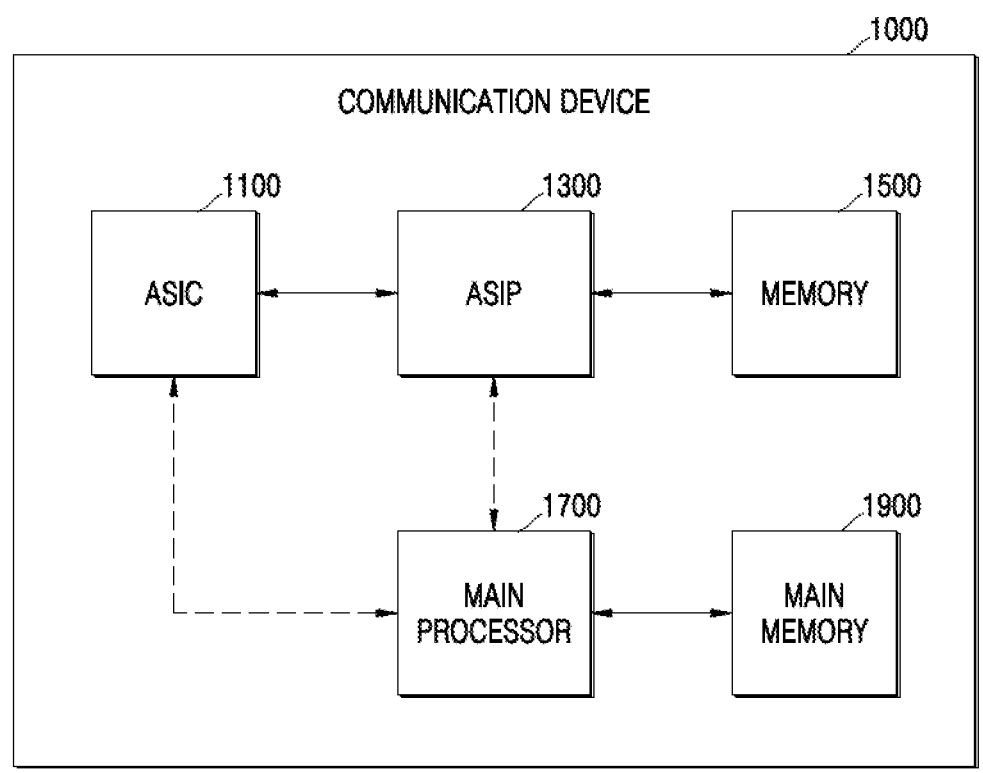
FIG. 14 is a diagram of a communication device according to an example embodiment.

FIG. 14 is a diagram of a communication device 1000 according to an example embodiment. As shown in FIG. 14, the communication device 1000 may include an application-specific integrated circuit (ASIC) 1100, an application-specific instruction set processor (ASIP) 1300, a memory 1500, a main processor 1700, and a main memory 1900. At least two of the ASIC 1100, the ASIP 1300, and the main processor 1700 may communicate with each other. Also, at least two of the ASIC 1100, the ASIP 1300, the memory 1500, the main processor 1700, and the main memory 1900 may be embedded in a single chip.

The ASIP 1300, which may be a customized IC for specific purposes, may support a dedicated instruction set for a specific application and execute instructions included in the instruction set. The memory 1500 may communicate with the ASIP 1300 and serve as a non-transitory storage device to store a plurality of instructions executed by the ASIP 1300. For example, the memory 1500 may include, but is not limited thereto, an arbitrary type of memory accessible by the ASIP 1300, for example, random access memory (RAM), read-only memory (ROM), a tape, a magnetic disc, an optical disc, a volatile memory, a non-volatile memory, and a combination thereof.

The main processor 1700 may execute a plurality of instructions and control the communication device 1000. For example, the main processor 1700 may control the ASIC 1100 and the ASIP 1300 and process data received through a multiple-input and multiple-output (MIMO) channel or process a user's input for the communication device 1000. The main memory 1900 may communicate with the main processor 1700 and serve as a non-transitory storage device to store the plurality of instructions executed by the main processor 1700. For example, the main memory 1900 may include, but is not limited thereto, an arbitrary type of memory accessible by the main processor 1700, for example, RAM, ROM, a tape, a magnetic disc, an optical disc, a volatile memory, a non-volatile memory, and a combination thereof.

The above-described method of compensating for the nonlinearity of the transmitter, according to the example embodiment, may be performed by at least one of the components included in the communication device 1000 of FIG. 14. For example, the above-described processor may be included in at least one of the ASIC 1100, the ASIP 1300, the memory 1500, the main processor 1700, and the main memory 1900 of FIG. 14. In some embodiments, at least one of operations of the above-described method of compensating for the nonlinearity of the power amplifier may be implemented as a plurality of instructions stored in the memory 1500. In some embodiments, the ASIP 1300 may perform at least one of the operations of the method of compensating for the nonlinearity of the power amplifier by executing the plurality of instructions stored in the memory 1500. In some embodiments, at least one of the operations of the method of compensating for the nonlinearity of the power amplifier may be implemented as a hardware block designed through logical synthesis and included in the ASIC 1100. In some embodiments, at least one of the operations of the method of compensating for the nonlinearity of the power amplifier may be implemented as a plurality of instructions stored in the main memory 1900. The main processor 1700 may perform at least one of the operations of the method of compensating for the nonlinearity of the power amplifier by executing the plurality of instructions stored in the main memory 1900.

Typical example embodiments of the inventive concept are disclosed in the above description and the drawings. Although specific terms are employed, the terms are used in a generic and descriptive sense only and not for purposes of limitation. It will be understood by those of ordinary skill in the art that various changes in form and details may be made to the disclosed embodiments without departing from the spirit and scope of the inventive concept as defined by the following claims.

What is claimed is:

1. A device configured to perform wireless communication, the device comprising:
a pre-distortion circuit configured to pre-distort an input signal based on a parameter set comprising a plurality of coefficients and generate a pre-distorted signal;
a power amplifier configured to amplify the pre-distorted signal and generate an output signal; and
a parameter obtaining circuit configured to perform an iterative approximation operation based on the output signal changing over time and the pre-distorted signal, according to an indirect training structure configured to minimize a difference between an intermediate signal obtained based on the output signal and the pre-distorted signal, and obtain the parameter set; and
a memory configured to store a past auto-correlation matrix and a past cross-correlation vector,
wherein the parameter obtaining circuit obtains, as the parameter set, the plurality of coefficients for minimizing a magnitude of an error signal indicating a difference between an intermediate signal, which is obtained based on the output signal and the plurality of coefficients, and the pre-distorted signal,
wherein the parameter obtaining circuit generates an auto-correlation matrix used in a matrix equation, based on the output signal and the past auto-correlation matrix, and generates a cross-correlation vector used in the matrix equation, based on the output signal, the pre-distorted signal and the past cross-correlation vector, wherein the matrix equation is an equivalent to a problem of minimizing the magnitude of the error signal by using a Wiener filter.

2. The device of claim 1, wherein
the parameter obtaining circuit is configured to perform the iterative approximation operation based on a conjugate gradient method and obtain the parameter set.

3. The device of claim 1, wherein
the parameter obtaining circuit performs the iterative approximation operation using the auto-correlation matrix and the cross-correlation vector and obtains a coefficient matrix such that a magnitude of a residue indicating a difference between a multiplication of the auto-correlation matrix by a coefficient matrix including the plurality of coefficients and the cross-correlation vector is equal to or less than a critical value.

4. The device of claim 1, wherein
the parameter obtaining circuit updates the auto-correlation matrix based on the output signal, which changes over time, updates the cross-correlation vector based on the output signal and the pre-distorted signal, which change over time, and obtains a coefficient matrix comprising the plurality of coefficients as the parameter set based on the updated auto-correlation matrix and the updated cross-correlation vector.

5. The device of claim 4, wherein
the iterative approximation operation comprises a plurality of gradient-based approximation operations, which are iteratively performed,
wherein the parameter obtaining circuit
updates the auto-correlation matrix and the cross-correlation vector whenever one gradient-based approximation operation is performed.

6. The device of claim 4, wherein
the iterative approximation operation comprises a plurality of gradient-based approximation operations, which are iteratively performed, and
wherein the parameter obtaining circuit updates the auto-correlation matrix and the cross-correlation vector whenever a predetermined number of gradient-based approximation operations are performed.

7. The device of claim 4, wherein
the parameter obtaining circuit updates the auto-correlation matrix using a method of calculating an average weight value using a temporary auto-correlation matrix obtained based on the output signal and the past auto-correlation matrix corresponding to an immediately previous time sample and obtaining an auto-correlation matrix corresponding to a current time point, and updates the cross-correlation vector using a method of calculating an average weight value using a temporary cross-correlation vector obtained based on the output signal and the pre-distorted signal and the past cross-correlation vector corresponding to the immediately previous time sample and obtaining a cross-correlation vector corresponding to the current time point.

8. The device of claim 1, wherein
the pre-distortion circuit performs a pre-distortion using coefficients in a predetermined coefficient group, from among the plurality of coefficients, and
wherein the device further comprises a performance evaluator configured to evaluate performance of the device and change a coefficient group used by the pre-distortion circuit when the evaluated performance of the device is equal to or less than critical performance.

9. A method of amplifying a signal of a device, the method comprising:
obtaining an auto-correlation matrix based on an output signal and a past auto-correlation matrix stored in a memory, and a cross-correlation vector based on a pre-distorted signal, the output signal and a past cross-correlation vector stored in the memory, wherein the pre-distorted signal is obtained by pre-distorting an input signal;
performing an iterative approximation operation based on the auto-correlation matrix and the cross-correlation vector and generating a coefficient matrix;
providing the pre-distorted signal to a power amplifier, wherein the pre-distorted signal is generated by performing pre-distortion using a plurality of coefficients in the coefficient matrix; and
amplifying the pre-distorted signal and generating the output signal.

10. The method of claim 9, wherein
the generating of the coefficient matrix comprises obtaining the coefficient matrix by using a conjugate gradient method such that a magnitude of a residue indicating a difference between a vector obtained by multiplying the auto-correlation matrix by the coefficient matrix and the cross-correlation vector is equal to or less than a critical value.

11. The method of claim 9, wherein
the generating of the coefficient matrix comprises:
obtaining an initial residue based on a set initial coefficient matrix;
iteratively performing a plurality of gradient-based approximation operations and updating the coefficient matrix and a residue; and
outputting a final updated coefficient matrix as a parameter set when a magnitude of the updated residue is a critical value or less.

12. The method of claim 11, wherein
the updating of the coefficient matrix and the residue comprises:
calculating a gradient vector based on the coefficient matrix and the residue; and
updating the coefficient matrix and the residue based on the calculated gradient vector.

13. The method of claim 9, wherein
the obtaining of the auto-correlation matrix and the cross-correlation vector
comprises obtaining an auto-correlation matrix corresponding to a current time point and a cross-correlation vector corresponding to the current time point with respect to the auto-correlation matrix and the cross-correlation vector, which change over time.

14. The method of claim 13, wherein
the obtaining of the auto-correlation matrix corresponding to the current time point and the cross-correlation vector corresponding to the current time point comprises:
obtaining the auto-correlation matrix corresponding to the current time point by calculating an average weight value using a temporary auto-correlation matrix obtained based on the output signal and the past auto-correlation matrix corresponding to a previous time sample; and
obtaining the cross-correlation vector corresponding to the current time point by calculating an average weight value using a temporary cross-correlation vector obtained based on the output signal and the pre-distorted signal and the past cross-correlation vector corresponding to the previous time sample.

15. The method of claim 9, wherein
the providing of the pre-distorted signal to the power amplifier comprises:
performing a pre-distortion operation using first coefficients corresponding to a first coefficient group, from among the plurality of coefficients;
evaluating performance of the device; and
performing a pre-distortion operation using second coefficients corresponding to a second coefficient group, from among the plurality of coefficients, when the evaluated performance is equal to or less than critical performance, wherein the second coefficient group is different from the first coefficient group.

16. A device configured to perform wireless communication, the device comprising:
a power amplifier configured to amplify a pre-distorted signal and generate an output signal;
a memory configured to store a past auto-correlation matrix and a past cross-correlation vector ; and
a processor configured to obtain a solution of a matrix equation using an auto-correlation matrix obtained based on the output signal and the past auto-correlation matrix and a cross-correlation vector obtained based on the output signal, the pre-distorted signal and the past cross-correlation vector, by using a conjugate gradient method, pre-distort an input signal using a plurality of coefficients in the solution, and provide the pre-distorted signal to the power amplifier.

17. The device of claim 16, wherein
the processor updates the auto-correlation matrix using a method of obtaining an auto-correlation matrix corresponding to a current time point by calculating an average weight value using a temporary auto-correlation matrix obtained based on the output signal and the past an auto-correlation matrix corresponding to a previous time sample, updates the cross-correlation vector using a method of obtaining a cross-correlation vector corresponding to the current time point by calculating an average weight value using a temporary cross-correlation vector obtained based on the output signal and the pre-distorted signal and the past cross-correlation vector corresponding to the previous time sample, and obtain the solution using an updated auto-correlation matrix and an updated cross-correlation vector.

18. The device of claim 16, wherein
the processor performs pre-distortion using first coefficients in a first coefficient group, from among the plurality of coefficients, and performs pre-distortion using second coefficients in a second coefficient group when performance of the device is equal to or less than critical performance.

* * * * *